(12) United States Patent
Ogawa

(10) Patent No.: US 12,119,801 B2
(45) Date of Patent: Oct. 15, 2024

(54) MULTILAYER LC FILTER

(71) Applicant: Murata Manufacturing Co., Ltd., Nagaokakyo (JP)

(72) Inventor: Keisuke Ogawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 324 days.

(21) Appl. No.: 17/696,390

(22) Filed: Mar. 16, 2022

(65) Prior Publication Data

US 2022/0209736 A1     Jun. 30, 2022

Related U.S. Application Data

(63) Continuation of application No. PCT/JP2020/037927, filed on Oct. 7, 2020.

(30) Foreign Application Priority Data

Oct. 24, 2019  (JP) .................................. 2019-193518

(51) Int. Cl.
*H03H 7/01*           (2006.01)
*H01G 4/40*          (2006.01)

(52) U.S. Cl.
CPC ............ *H03H 7/0161* (2013.01); *H01G 4/40* (2013.01); *H03H 7/1775* (2013.01)

(58) Field of Classification Search
CPC ...... H03H 7/01; H03H 7/0161; H03H 7/1775; H03H 7/1776; H03H 7/0115; H03H 2001/0085
USPC .......................... 333/175, 177, 184, 185, 204
See application file for complete search history.

(56) References Cited

U.S. PATENT DOCUMENTS 11,817,843 B2 * 11/2023 Motoyama ........... H03H 7/1758
2011/0074526 A1    3/2011 Taniguchi
2017/0093358 A1    3/2017 Imamura

FOREIGN PATENT DOCUMENTS

| EP | 2 009 787 A1 | 12/2008 |
|---|---|---|
| JP | 2011-071921 A | 4/2011 |
| JP | 2017-063394 A | 3/2017 |
| WO | 2007/119356 A1 | 10/2007 |

OTHER PUBLICATIONS

Official Communication issued in International Patent Application No. PCT/JP2020/037927, mailed on Nov. 24, 2020.

* cited by examiner

*Primary Examiner* — Hai L Nguyen
(74) *Attorney, Agent, or Firm* — Keating & Bennett, LLP

(57) ABSTRACT

A multilayer LC filter includes a multilayer body in which insulator layers, a ground electrode, capacitor electrodes, a planar electrode, and via electrodes includes open-side via electrodes connecting the capacitor electrodes and the planar electrode and short-circuit side via electrodes connecting the planar electrode and the ground electrode, an inductor is provided by a conductive path extending from the capacitor electrodes to the ground electrode through the open-side via electrodes, the planar electrode, and the short-circuit side via electrodes, a capacitor is provided by capacitance generated between the ground electrode and the capacitor electrodes, the inductor and the capacitor are connected in parallel to define LC resonators, and it is assumed that the short-circuit side via electrodes of all of the LC resonators in the multilayer body are made common.

18 Claims, 16 Drawing Sheets

MULTILAYER LC FILTER

CROSS REFERENCE TO RELATED APPLICATIONS

This application claims the benefit of priority to Japanese Patent Application No. 2019-193518 filed on Oct. 24, 2019 and is a Continuation application of PCT Application No. PCT/JP2020/037927 filed on Oct. 7, 2020. The entire contents of each application are hereby incorporated herein by reference.

BACKGROUND OF THE INVENTION

1. Field of the Invention

The present invention relates to a multilayer LC filter in which a plurality of LC resonators is included in a multilayer body in which a plurality of insulator layers is laminated.

2. Description of the Related Art

A multilayer LC filter in which a plurality of LC resonators is formed in a multilayer body in which a plurality of insulator layers is laminated is widely used in electronic devices such as communication devices. For example, WO 2007/119356A1 discloses such a multilayer LC filter. FIG. 16 illustrates a multilayer LC filter 1000 disclosed in WO 2007/119356A1.

The multilayer LC filter 1000 includes a multilayer body 101 in which a plurality of insulator layers 101*a* to 101*d* is laminated. The multilayer body 101 has a rectangular parallelepiped shape.

A ground electrode 102 is formed on a main surface of the insulator layer 101*a*. A plurality of capacitor electrodes 103 is formed on a main surface of the insulator layer 101*b*. A plurality of planar electrodes 104 is formed on a main surface of the insulator layer 101*c*. The insulator layer 101*d* is a protection layer and is not provided with an electrode.

The capacitor electrode 103 and one end of the planar electrode 104 are connected by an open-side via electrode 105*b* formed so as to extend the insulator layer 101*c*. The other end of the planar electrode 104 and the ground electrode 102 are connected by a short-circuit side via electrode 105*a* formed so as to extend the insulator layers 101*b* and 101*c*. An inductor is formed by a conductive path extending from the capacitor electrode 103 to the ground electrode 102 through the open-side via electrode 105*b*, the planar electrode 104, and the short-circuit side via electrode 105*a*.

A capacitor is formed by a capacitance formed between the ground electrode 102 and the capacitor electrode 103.

An inductor and a capacitor are connected in parallel to form an LC resonator. A plurality of LC resonators is formed in parallel with each other between a pair of opposing end surfaces of the multilayer body 1. Adjacent LC resonators are electromagnetic field coupled to each other.

SUMMARY OF THE INVENTION

In the multilayer LC filter 1000, a plurality of LC resonators is arranged adjacent to each other in parallel between a pair of opposing end surfaces of the multilayer body 1, therefore, there has been a problem in that when the multilayer LC filter 1000 is reduced in size or has multiple stages, the distance between the LC resonators is reduced, and the Q value of the LC resonator is degraded. Additionally, there has been a problem in that, as the Q value of the LC resonator is degraded, the frequency characteristics and insertion loss of the multilayer LC filter 1000 deteriorate.

Preferred embodiments of the present invention provide multilayer LC filters in each of which a structure of an LC resonator is reviewed and characteristics are improved while maintaining product size.

A multilayer LC filter according to an aspect of a preferred embodiment of the present invention includes a multilayer body in which a plurality of insulator layers is laminated, at least one ground electrode between the insulator layers, a plurality of capacitor electrodes between the insulator layers, at least one planar electrode between the insulator layers, and a plurality of via electrodes penetrating the insulator layers, in which the multilayer body has a rectangular or substantially rectangular parallelepiped shape and has a height direction that is a lamination direction of the insulator layers, a length direction orthogonal to the height direction, and a width direction orthogonal to each of the height direction and the length direction, the via electrode includes an open-side via electrode connecting the capacitor electrode and the planar electrode and a short-circuit side via electrode connecting the planar electrode and a ground electrode, an inductor includes a conductive path extending from the capacitor electrode to the ground electrode through the open-side via electrode, the planar electrode, and the short-circuit side via electrode, a capacitor is provided by a capacitance generated between the ground electrode and the capacitor electrode, the inductor and the capacitor are connected in parallel to provide an LC resonator, and a plurality of the LC resonators is included in the multilayer body, and in the multilayer LC filter, the short-circuit side via electrode of all of the LC resonators in the multilayer body is a common electrode.

In a multilayer LC filter according to a preferred embodiment of the present invention, the Q value of an LC resonator is improved and the characteristics are improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
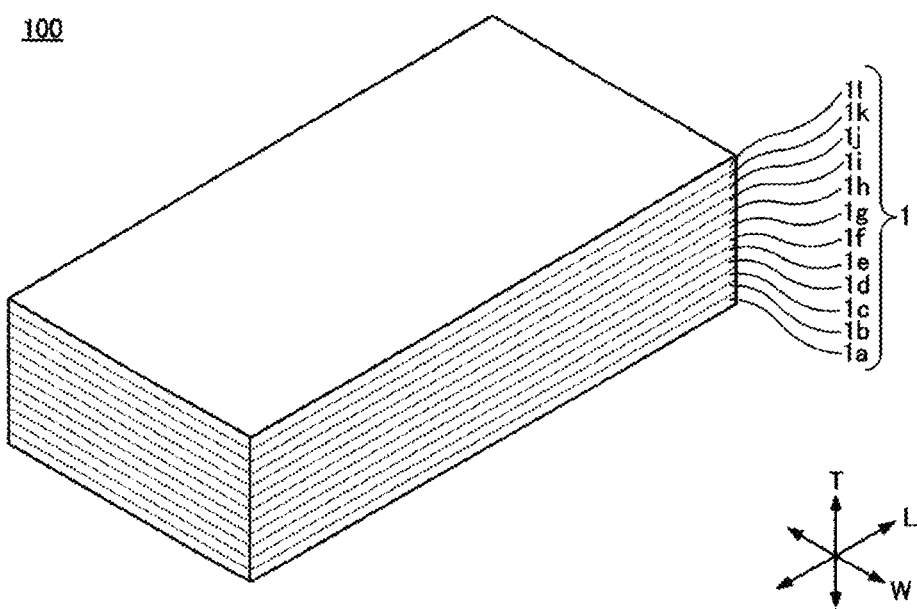
FIG. 1A is a perspective view of a multilayer LC filter 100 according to a first preferred embodiment of the present invention viewed from a top surface side.

Hereinafter, preferred embodiments of the present invention will be described with reference to the accompanying drawings.

It should be noted that each of the preferred embodiments is merely an example of the present invention, and the present invention is not limited to the contents of the preferred embodiments. In addition, contents described in different preferred embodiments can be combined and implemented, and the implementation contents in that case are also included in preferred embodiments of the present invention. In addition, the drawings are intended to help understanding of the specification, and may be schematically drawn, and drawn components or the ratio of dimensions of the drawn components does not match in some cases the ratio of dimensions of the components described in the specification. In addition, the components described in the specification may be omitted in the drawings, or the component may be drawn by abbreviating the number of components.

First Preferred Embodiment

FIGS. 1A and 1B, FIGS. 2A and 2B, FIG. 3, and FIG. 4 show a multilayer LC filter 100 according to a first preferred embodiment.

Note that in the drawings, a height direction T, a length direction L, and a width direction W of the multilayer LC filter 100 may be indicated by arrows, and these directions may be referred to in the following description. In addition, the height direction T is a direction in which insulator layers 1a to 11 described later are laminated. The length direction L is a direction in which a first input/output terminal T1 and a second input/output terminal T2 to be described later are arranged. The width direction W is a direction orthogonal to each of the height direction T and the length direction L. Note that the height direction T, the length direction L, and the width direction W of the multilayer LC filter 100 are also the height direction T, the length direction L, and the width direction W of the multilayer body 1 described later.

Figure 1B:
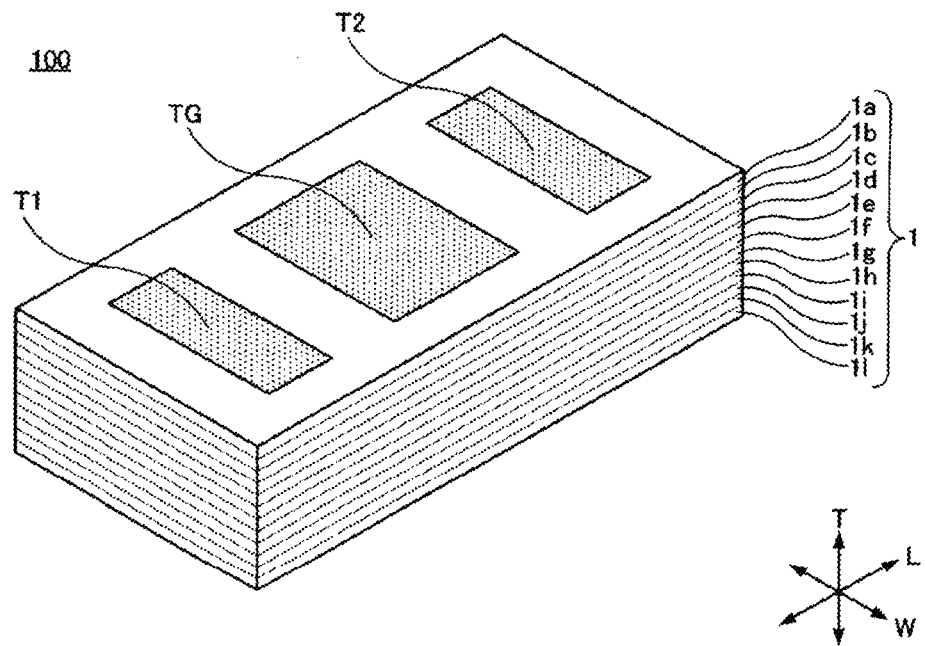
FIG. 1B is a perspective view of the multilayer LC filter 100 viewed from a mounting surface side.
Figure 2A:
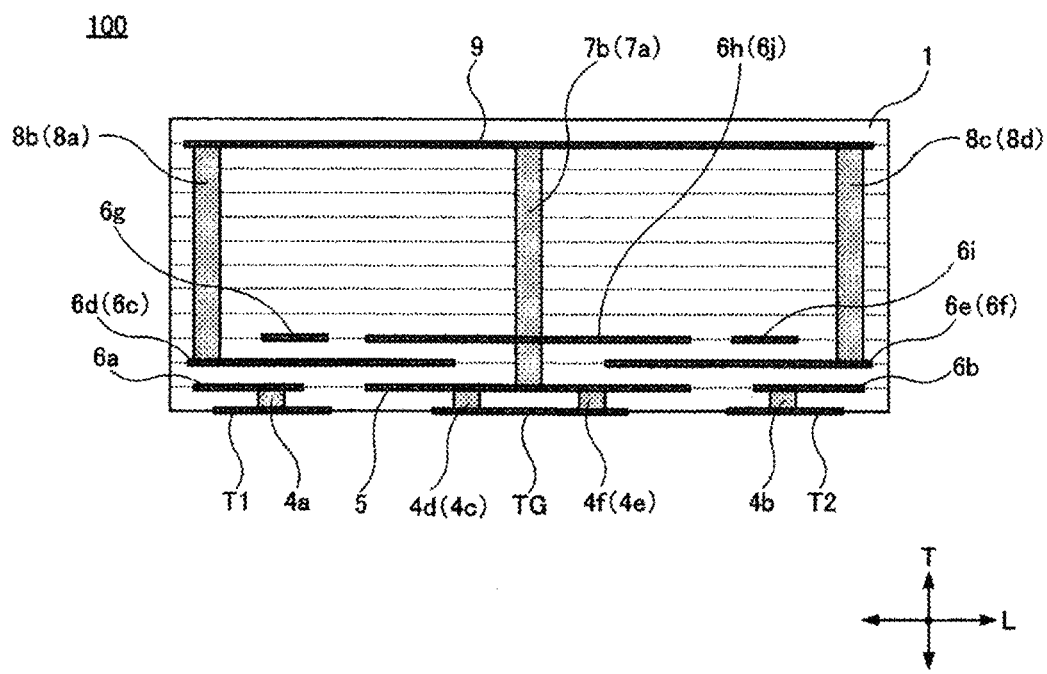
FIG. 2A is a perspective view of the multilayer LC filter 100 viewed in a width direction W.
Figure 2B:
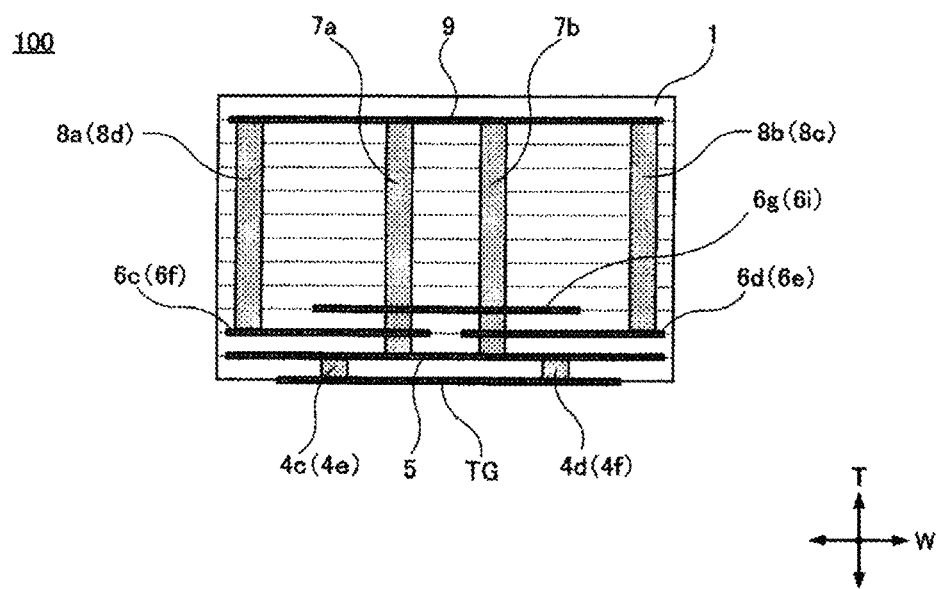
FIG. 2B is a perspective view of the multilayer LC filter 100 viewed in a length direction L.
Figure 3:
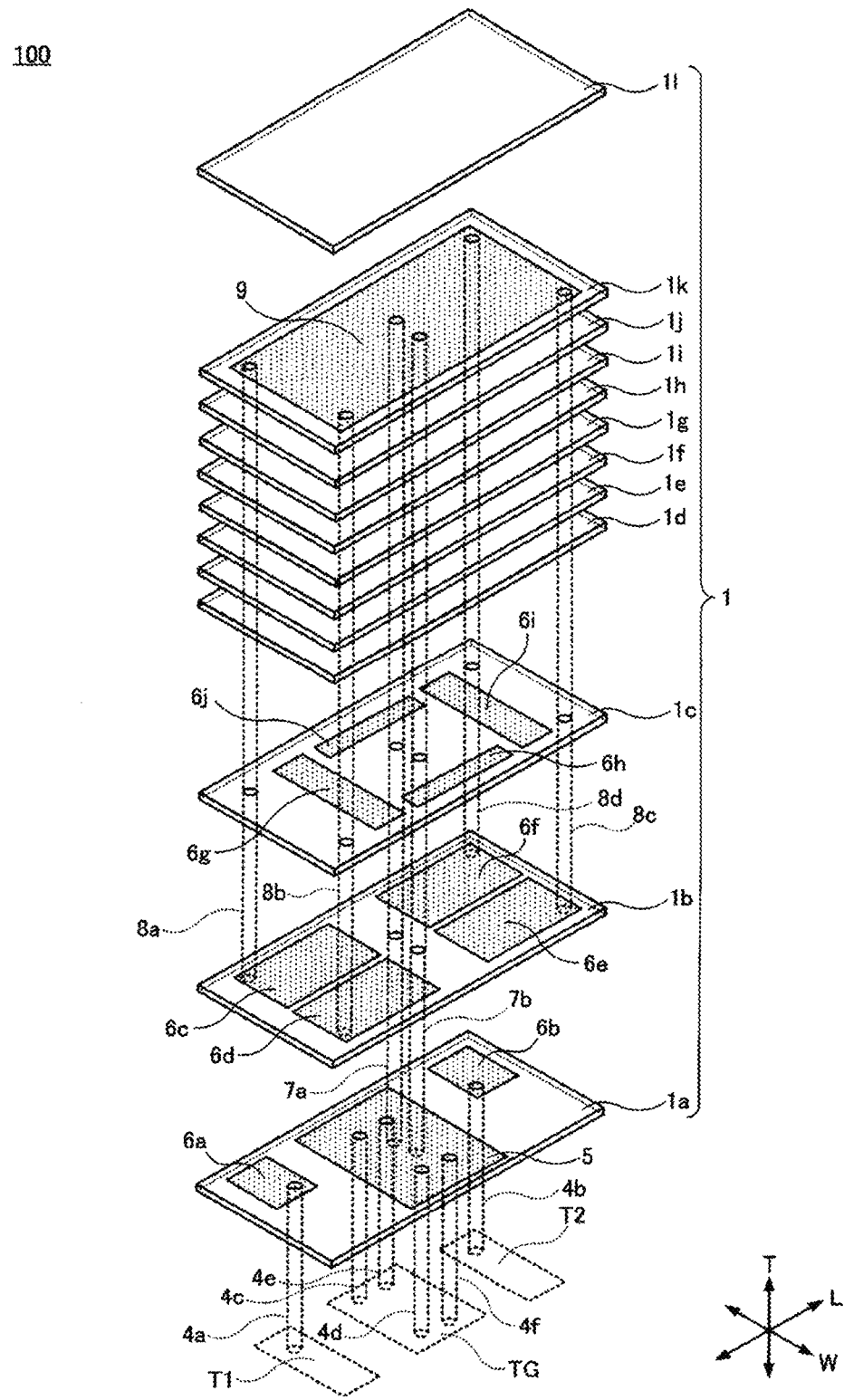
FIG. 3 is an exploded perspective view of the multilayer LC filter 100.
Figure 4:
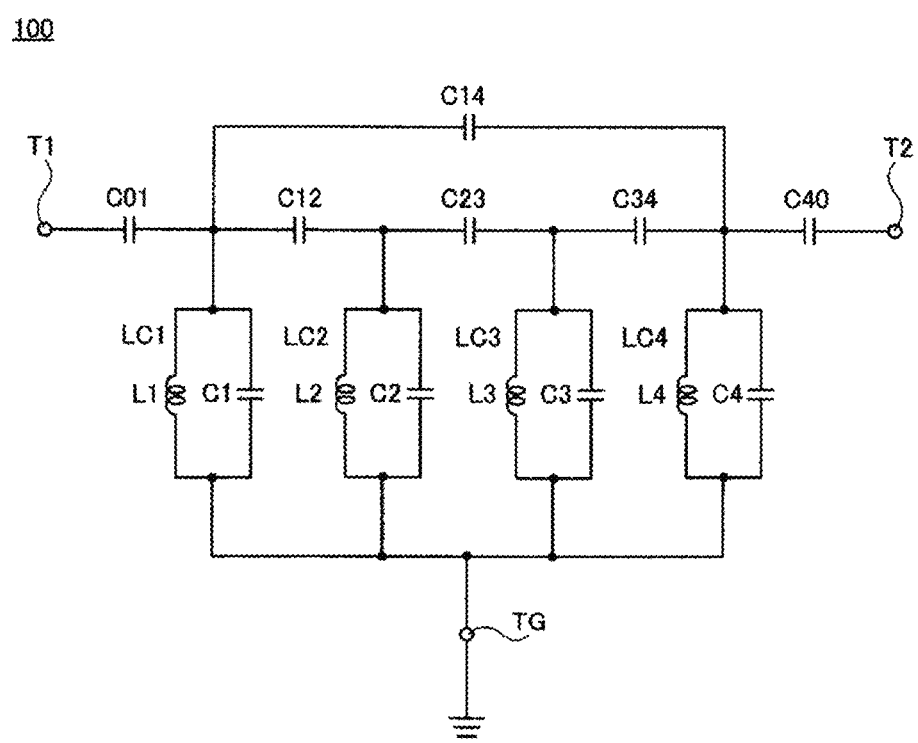
FIG. 4 is an equivalent circuit diagram of the multilayer LC filter 100.

FIG. 1A is a perspective view of the multilayer LC filter 100 viewed from the top surface side. FIG. 1B is a perspective view of the multilayer LC filter 100 viewed from the mounting surface side. FIG. 2A is a perspective view of the multilayer LC filter 100 viewed in the width direction W. FIG. 2B is a perspective view of the multilayer LC filter 100 viewed in the length direction L. Note that in FIGS. 2A and 2B, in the case where a plurality of components overlaps with each other, components with higher importance are illustrated and components with lower importance are omitted in the description using the drawings in some cases. FIG. 3 is an exploded perspective view of the multilayer LC filter 100. FIG. 4 is an equivalent circuit diagram of the multilayer LC filter 100.

The multilayer LC filter 100 includes a multilayer body 1. The multilayer body 1 is preferably formed by laminating insulator layers 1a to 11. The multilayer body 1 (insulator layers 1a to 11) may include, for example, low-temperature co-fired ceramics. However, a material of the multilayer body 1 is not limited to low-temperature co-fired ceramics, and may be other types of ceramics, resin, or the like.

Hereinafter, the configuration of each of the insulator layers 1a to 11 will be described.

The first input/output terminal T1, the second input/output terminal T2, and a ground terminal TG are provided on a lower main surface of the insulator layer 1a. Note that in FIG. 3, for convenience of drawing, the first input/output terminal T1, the second input/output terminal T2, and the ground terminal TG are indicated by broken lines apart from the insulator layer 1a.

Via electrodes 4a, 4b, 4c, 4d, 4e, and 4f extend between both main surfaces of the insulator layer 1a.

A ground electrode 5 and capacitor electrodes 6a and 6b are provided on an upper main surface of the insulator layer 1a.

Common short-circuit side via electrodes 7a and 7b extend between both main surfaces of the insulator layer 1b.

Capacitor electrodes 6c, 6d, 6e, and 6f are provided on an upper main surface of the insulator layer 1b.

The common short-circuit side via electrodes 7a and 7b described above extend between both main surfaces of the insulator layer 1c. In addition, open-side via electrodes 8a, 8b, 8c, and 8d extend between both main surfaces of the insulator layer 1c.

Capacitor electrodes 6g, 6h, 6i, and 6j are provided on an upper main surface of the insulator layer 1c.

The common short-circuit side via electrodes 7a and 7b and the open-side via electrodes 8a, 8b, 8c, and 8d described above extend between both main surfaces of the insulator layer 1d.

The common short-circuit side via electrodes 7a and 7b and the open-side via electrodes 8a, 8b, 8c, and 8d described above extend between both main surfaces of the insulator layer 1e.

The common short-circuit side via electrodes 7a and 7b and the open-side via electrodes 8a, 8b, 8c, and 8d described above extend between both main surfaces of the insulator layer 1f.

The common short-circuit side via electrodes 7a and 7b and the open-side via electrodes 8a, 8b, 8c, and 8d described above extend between both main surfaces of the insulator layer 1g.

The common short-circuit side via electrodes 7a and 7b and the open-side via electrodes 8a, 8b, 8c, and 8d described above extend between both main surfaces of the insulator layer 1h.

The common short-circuit side via electrodes 7a and 7b and the open-side via electrodes 8a, 8b, 8c, and 8d described above extend between both main surfaces of the insulator layer 1i.

The common short-circuit side via electrodes 7a and 7b and the open-side via electrodes 8a, 8b, 8c, and 8d described above extend between both main surfaces of the insulator layer 1j.

The common short-circuit side via electrodes 7a and 7b and the open-side via electrodes 8a, 8b, 8c, and 8d described above extend between both main surfaces of the insulator layer 1k.

A rectangular or substantially rectangular planar electrode 9 is provided on substantially the entire upper main surface of the insulator layer 1k.

The insulator layer 11 is a protection layer and is not provided with an electrode.

The materials of the first input/output terminal T1, the second input/output terminal T2, the ground terminal TG, the via electrodes 4a to 4f, the ground electrode 5, the capacitor electrodes 6a to 6j, the common short-circuit side via electrodes 7a and 7b, the open-side via electrodes 8a to 8d, and the planar electrode 9 are each arbitrary, and copper, silver, aluminum, or the like, or an alloy thereof may be used as a main component, for example. Note that a plating layer may be provided on the surfaces of the first input/output terminal T1, the second input/output terminal T2, and the ground terminal TG.

The multilayer LC filter 100 can be manufactured by an existing manufacturing method used for manufacturing a multilayer LC filter.

Next, connection relationships among the first input/output terminal T1, the second input/output terminal T2, the ground terminal TG, the via electrodes 4a to 4f, the ground electrode 5, the capacitor electrodes 6a to 6j, the common short-circuit side via electrodes 7a and 7b, the open-side via electrodes 8a to 8d, and the planar electrode 9 in the multilayer LC filter 100 will be described.

The first input/output terminal T1 is connected to the capacitor electrode 6a by the via electrode 4a. The second input/output terminal T2 is connected to the capacitor electrode 6b by the via electrode 4b. The ground terminal TG is connected to the ground electrode 5 by the via electrodes 4c to 4f.

The capacitor electrode 6c is connected to the planar electrode 9 by the open-side via electrode 8a. The capacitor electrode 6d is connected to the planar electrode 9 by the open-side via electrode 8b. The capacitor electrode 6e is connected to the planar electrode 9 by the open-side via electrode 8c. The capacitor electrode 6f is connected to the planar electrode 9 by the open-side via electrode 8d.

The planar electrode 9 is connected to the ground electrode 5 by the common short-circuit side via electrodes 7a and 7b.

The multilayer LC filter 100 having the above-described structure includes an equivalent circuit illustrated in FIG. 4.

The multilayer LC filter 100 includes the first input/output terminal T1, the second input/output terminal T2, and the ground terminal TG. Note that the ground terminal TG is connected to the ground when the multilayer LC filter 100 is used.

Between the first input/output terminal T1 and the second input/output terminal T2, capacitors C01, C12, C23, C34, and C40 are connected in this order.

A capacitor C14 is connected between a connection point between the capacitor C01 and the capacitor C12 and a connection point between the capacitor C34 and the capacitor C40.

A first LC resonator LC1 including an inductor L1 and a capacitor C1 that are connected in parallel is connected between the connection point of the capacitor C01 and the capacitor C12 and the ground (ground terminal TG).

A second LC resonator LC2 including an inductor L2 and a capacitor C2 that are connected in parallel is connected between the connection point of the capacitor C12 and the capacitor C23 and the ground.

A third LC resonator LC3 including an inductor L3 and a capacitor C3 that are connected in parallel is connected between the connection point of the capacitor C23 and the capacitor C34 and the ground.

A fourth LC resonator LC4 including an inductor L4 and a capacitor C4 that are connected in parallel is connected between the connection point of the capacitor C34 and the capacitor C40 and the ground.

The first LC resonator LC1 and the second LC resonator LC2 are electromagnetic field coupled to each other. The second LC resonator LC2 and the third LC resonator LC3 are electromagnetic field coupled to each other. The third LC resonator LC3 and the fourth LC resonator LC4 are electromagnetic field coupled to each other.

The multilayer LC filter 100 includes the above-described equivalent circuits thus defining a four-stage band pass LC filter. Note that the capacitor C01 and the capacitor C40 each may be omitted.

Next, the relationship between the structure of the multilayer LC filter 100 illustrated in FIGS. 2A and 2B and FIG. 3 and the equivalent circuit of the multilayer LC filter 100 illustrated in FIG. 4 will be described.

As described above, the first input/output terminal T1 is connected to the capacitor electrode 6a by the via electrode 4a. The capacitor C01 is provided by the capacitance generated between the capacitor electrode 6a and the capacitor electrode 6c.

The capacitor C12 is provided by the capacitance generated between the capacitor electrode 6c and the capacitor electrode 6g and the capacitance generated between the capacitor electrode 6g and the capacitor electrode 6d, which are connected in series with each other.

The capacitor C23 is provided by the capacitance generated between the capacitor electrode 6d and the capacitor electrode 6h and the capacitance generated between the capacitor electrode 6h and the capacitor electrode 6e, which are connected in series with each other.

The capacitor C34 is provided by the capacitance generated between the capacitor electrode 6e and the capacitor electrode 6i and the capacitance generated between the capacitor electrode 6i and the capacitor electrode 6f, which are connected in series with each other.

The capacitor C14 is provided by the capacitance generated between the capacitor electrode 6c and the capacitor electrode 6j and the capacitance generated between the capacitor electrode 6j and the capacitor electrode 6f, which are connected in series with each other.

The capacitor C40 is provided by the capacitance generated between the capacitor electrode 6f and the capacitor electrode 6b. As described above, the capacitor electrode 6b is connected to the second input/output terminal T2 by the via electrode 4b.

The inductor L1 is provided by a conductive path extending from the capacitor electrode 6c to the ground electrode 5 through the open-side via electrode 8a, the planar electrode 9, and the common short-circuit side via electrodes 7a and 7b. The capacitor C1 is provided by the capacitance generated between the capacitor electrode 6c and the ground electrode 5. As described above, the inductor L1 and the capacitor C1 define the first LC resonator LC1.

The inductor L2 is provided by a conductive path extending from the capacitor electrode 6d to the ground electrode 5 through the open-side via electrode 8b, the planar electrode 9, and the common short-circuit side via electrodes 7a and 7b. The capacitor C2 is provided by the capacitance generated between the capacitor electrode 6d and the ground electrode 5. As described above, the inductor L2 and the capacitor C2 define the second LC resonator LC2.

The inductor L3 is provided by a conductive path extending from the capacitor electrode 6e to the ground electrode 5 through the open-side via electrode 8c, the planar electrode 9, and the common short-circuit side via electrodes 7a and 7b. The capacitor C3 is provided by the capacitance generated between the capacitor electrode 6e and the ground electrode 5. As described above, the inductor L3 and the capacitor C3 define the third LC resonator LC3.

The inductor L4 is provided by a conductive path extending from the capacitor electrode 6f to the ground electrode 5 through the open-side via electrode 8d, the planar electrode 9, and the common short-circuit side via electrodes 7a and 7b. The capacitor C4 is provided by the capacitance generated between the capacitor electrode 6f and the ground electrode 5. As described above, the inductor L4 and the capacitor C4 define the fourth LC resonator LC4.

As described above, a ground electrode 5 is connected to the ground terminal TG by the via electrodes 4c to 4f.

As described above, the equivalent circuit of the multilayer LC filter 100 illustrated in FIG. 4 is configured by the structure of the multilayer LC filter 100 illustrated in FIGS. 2A and 2B and FIG. 3.

In the multilayer LC filter 100, as illustrated in FIG. 2A, the common short-circuit side via electrodes 7a and 7b are arranged between the open-side via electrodes 8a and 8b and the open-side via electrodes 8c and 8d in the length direction L. In addition, in the multilayer LC filter 100, as illustrated in FIG. 2B, the common short-circuit side via electrodes 7a and 7b are arranged between the open-side via electrodes 8a and 8d and the open-side via electrodes 8b and 8c in the width direction W. As a result, in the multilayer LC filter 100, when viewed in the height direction T (the lamination direction of the insulator layers 1a to 1l), the four open-side via electrodes 8a to 8d are separately arranged at four corners inside the multilayer body 1, and the common short-circuit side via electrodes 7a and 7b are arranged between the open-side via electrodes 8a to 8d.

In the multilayer LC filter 100, the short-circuit side via electrode of the first LC resonator LC1, the short-circuit side via electrode of the second LC resonator LC2, the short-circuit side via electrode of the third LC resonator LC3, and the short-circuit side via electrode of the fourth LC resonator LC4 are made common to be the common short-circuit side via electrodes 7a and 7b to improve the Q value of each of the first LC resonator LC1, the second LC resonator LC2, the third LC resonator LC3, and the fourth LC resonator LC4. The reason for this will be briefly described below.

That is, in the multilayer LC filter 100, the short-circuit side via electrodes of the first LC resonator LC1 to the fourth LC resonator LC4 are made common to be the common short-circuit side via electrodes 7a and 7b to improve the degree of freedom of arrangement of electrodes inside the multilayer body 1, and as described above, the open-side via electrodes 8a to 8d of the four first LC resonator LC1 to the fourth LC resonator LC4 can be separately arranged at four corners inside the multilayer body when viewed in the height direction T. Therefore, in the multilayer LC filter 100, the Q value of each of the first LC resonator LC1 to the fourth LC resonator LC4 is improved.

Further, in the multilayer LC filter 100, the short-circuit side via electrodes of the first LC resonator LC1 to the fourth LC resonator LC4 are made common to be the common short-circuit side via electrodes 7a and 7b such that the common short-circuit side via electrodes 7a and 7b are also short-circuit side via electrodes of other LC resonators for the first LC resonator LC1 to the fourth LC resonator LC4 but are their own short-circuit side via electrodes, and thus this does not cause deterioration of the Q value. Therefore, in the multilayer LC filter 100, the Q value of each of the first LC resonator LC1 to the fourth LC resonator LC4 is improved.

In addition, in the multilayer LC filter 100, since the short-circuit side via electrode that is made common for the first LC resonator LC1 to the fourth LC resonator LC4 is configured by the two common short-circuit side via electrodes 7a and 7b to reduce the resistance, the Q value of each of the first LC resonator LC1 to the fourth LC resonator LC4 is improved.

Further, in the multilayer LC filter 100, the common short-circuit side via electrodes 7a and 7b can be connected to the central portion of the ground electrode 5 because the degree of freedom in arrangement of the electrodes inside the multilayer body 1 is improved. Therefore, for example, in the inductor L1 of the first LC resonator LC1, a current flowing from the capacitor electrode 6c to the ground electrode 5 through the open-side via electrode 8a, the planar electrode 9, and the common short-circuit side via electrodes 7a and 7b can flow from the central portion of the ground electrode 5 in all circumferential directions (all directions of 360°). This also reduces the resistance and improves the Q value of the first LC resonator LC1. For the same reason, the Q value of each of the second LC resonator LC2 to the fourth LC resonator LC4 is also improved.

In the multilayer LC filter 100, since the Q value of each of the first LC resonator LC1 to the fourth LC resonator LC4 is improved, excellent frequency characteristics are provided and insertion loss is reduced.

In addition, in the multilayer LC filter 100, the short-circuit side via electrodes of the first LC resonator LC1 to the fourth LC resonator LC4 are made common to define and function as the common short-circuit side via electrodes 7a and 7b, thus improving the degree of freedom in arrangement of the electrodes inside the multilayer body 1, and for example, by forming the capacitor electrode 6j on the upper main surface of the insulator layer 1c, it is possible to easily form the skip coupling capacitor C14 between the first LC resonator LC1 and the fourth LC resonator LC4, which has been difficult to be formed.

Experiment 1

In order to confirm the effectiveness of various preferred embodiments of the present invention, the following experiment was conducted using a simulator.

First, as Example 1, a multilayer LC filter equivalent to the multilayer LC filter 100 according to the first preferred embodiment described above was prepared.

Figure 5:
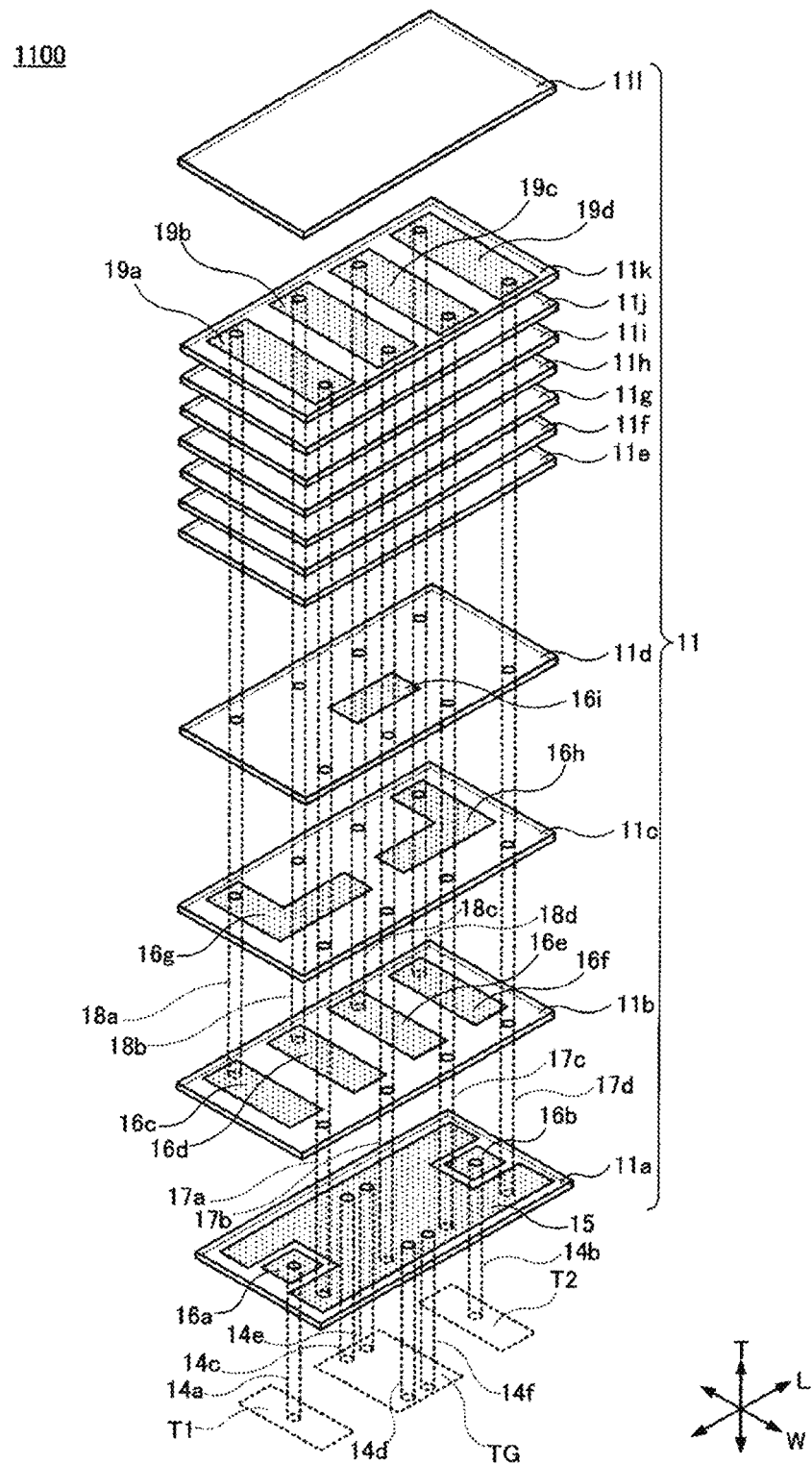
FIG. 5 is an exploded perspective view of a multilayer LC filter 1100 according to a comparative example.

As Comparative Example 1, a multilayer LC filter 1100 having an existing structure and including the same equivalent circuit (see FIG. 4) as the multilayer LC filter 100 was prepared. The structure of the LC filter 1100 is illustrated in FIG. 5. However, FIG. 5 is an exploded perspective view of the multilayer LC filter 1100.

The multilayer LC filter 1100 according to Comparative Example 1 includes a multilayer body 11 in which insulator layers 11a to 11l are laminated.

The first input/output terminal T1, the second input/output terminal T2, and the ground terminal TG are provided on a lower main surface of the insulator layer 11a. This is the same as the multilayer LC filter 100 according to Example 1.

Via electrodes 14a to 14f extend between both main surfaces of the insulator layer 11a.

The ground electrode 5 and capacitor electrodes 16a and 16b are provided on an upper main surface of the insulator layer 11a.

Short-circuit side via electrodes 17a, 17b, 17c, and 17d extend between both main surfaces of the insulator layer 11b.

Capacitor electrodes 16c, 16d, 16e, and 16f are provided on an upper main surface of the insulator layer 11b.

The short-circuit side via electrodes 17a, 17b, 17c, and 17d described above extend between both main surfaces of the insulator layer 11c. In addition, open-side via electrodes 18a, 18b, 18c, and 18d extend between both main surfaces of the insulator layer 11c.

Capacitor electrodes 16g and 16h are provided on an upper main surface of the insulator layer 11c.

The short-circuit side via electrodes 17a, 17b, 17c, and 17d, and the open-side via electrodes 18a, 18b, 18c, and 18d described above extend between both main surfaces of the insulator layer 11d.

A capacitor electrode 16i is provided on an upper main surface of the insulator layer 11d.

In each of the insulator layers 11e to 11k, the short-circuit side via electrodes 17a, 17b, 17c, and 17d, and the open-side via electrodes 18a, 18b, 18c, and 18d described above extend between both main surfaces.

Planar electrodes 19a, 19b, 19c, and 19d are provided on an upper main surface of the insulator layer 11k.

The insulator layer 11l is a protection layer and is not provided with an electrode.

The first input/output terminal T1 is connected to the capacitor electrode 16a by the via electrode 14a. A second input/output terminal T2 is connected to the capacitor electrode 16b by the via electrode 14b. The ground terminal TG is connected to the ground electrode 15 by the via electrodes 14c to 14f.

The capacitor electrode 16c is connected to one end of the planar electrode 19a by the open-side via electrode 18a. The capacitor electrode 16d is connected to one end of the planar electrode 19b by the open-side via electrode 18b. The capacitor electrode 16e is connected to one end of the planar electrode 19c by the open-side via electrode 18c. The capacitor electrode 16f is connected to one end of the planar electrode 19d by the open-side via electrode 18d.

The other end of the planar electrode 19a is connected to the ground electrode 15 by the short-circuit side via electrode 17a. The other end of the planar electrode 19b is connected to the ground electrode 15 by the short-circuit side via electrode 17b. The other end of the planar electrode 19c is connected to the ground electrode 15 by the short-circuit side via electrode 17c. The other end of the planar electrode 19d is connected to the ground electrode 15 by the short-circuit side via electrode 17d.

The multilayer LC filter 1100 according to Comparative Example 1 having the above-described structure includes the equivalent circuit illustrated in FIG. 4 similarly to the multilayer LC filter 110 according to Example 1.

That is, as described above, the first input/output terminal T1 is connected to the capacitor electrode 16a by the via electrode 14a. The capacitor C01 is provided by the capacitance generated between the capacitor electrode 16a and the capacitor electrode 16c.

The capacitor C12 is provided by the capacitance generated between the capacitor electrode 16g and the capacitor electrode 16d.

The capacitor C23 is provided by the capacitance generated between the capacitor electrode 16d and the capacitor electrode 16g, the capacitance generated between the capacitor electrode 16g and the capacitor electrode 16i, the capacitance generated between the capacitor electrode 16i and the capacitor electrode 16h, and the capacitance generated between the capacitor electrode 16h and the capacitor electrode 16e, which are connected to each other in series.

The capacitor C34 is provided by the capacitance generated between the capacitor electrode 16e and the capacitor electrode 16h.

The capacitor C14 is provided by the capacitance generated between the capacitor electrode 16g and the capacitor electrode 16i and the capacitance generated between the capacitor electrode 16i and the capacitor electrode 16h, which are connected in series with each other.

The capacitor C40 is provided by the capacitance generated between the capacitor electrode 16f and the capacitor electrode 16b. As described above, the capacitor electrode 16b is connected to the second input/output terminal T2 by the via electrode 14b.

The inductor L1 is provided by a conductive path extending from the capacitor electrode 16c to the ground electrode 15 through the open-side via electrode 18a, the planar electrode 19a, and the short-circuit side via electrode 17a. The capacitor C1 is provided by the capacitance generated between the capacitor electrode 16c and the ground electrode 15. As described above, the inductor L1 and the capacitor C1 define the first LC resonator LC1.

The inductor L2 is provided by a conductive path extending from the capacitor electrode 16d to the ground electrode 15 through the open-side via electrode 18b, the planar electrode 19b, and the short-circuit side via electrode 17b. The capacitor C2 is provided by the capacitance generated between the capacitor electrode 16d and the ground electrode 15. As described above, the inductor L2 and the capacitor C2 define the second LC resonator LC2.

The inductor L3 is provided by a conductive path extending from the capacitor electrode 16e to the ground electrode 15 through the open-side via electrode 18c, the planar electrode 19c, and the short-circuit side via electrode 17c. The capacitor C3 is provided by the capacitance generated between the capacitor electrode 16e and the ground electrode 15. As described above, the inductor L3 and the capacitor C3 define the third LC resonator LC3.

The inductor L4 is provided by a conductive path extending from the capacitor electrode 16f to the ground electrode 15 through the open-side via electrode 18d, the planar electrode 19d, and the short-circuit side via electrode 17d. The capacitor C4 is provided by the capacitance generated between the capacitor electrode 16f and the ground electrode 15. As described above, the inductor L4 and the capacitor C4 define the fourth LC resonator LC4.

As described above, the ground electrode 15 is connected to the ground terminal TG by the via electrodes 14c to 14f.

As described above, the multilayer LC filter 1100 according to Comparative Example 1 has the same equivalent circuit as that of the multilayer LC filter 100 illustrated in FIG. 4.

Figure 6A:
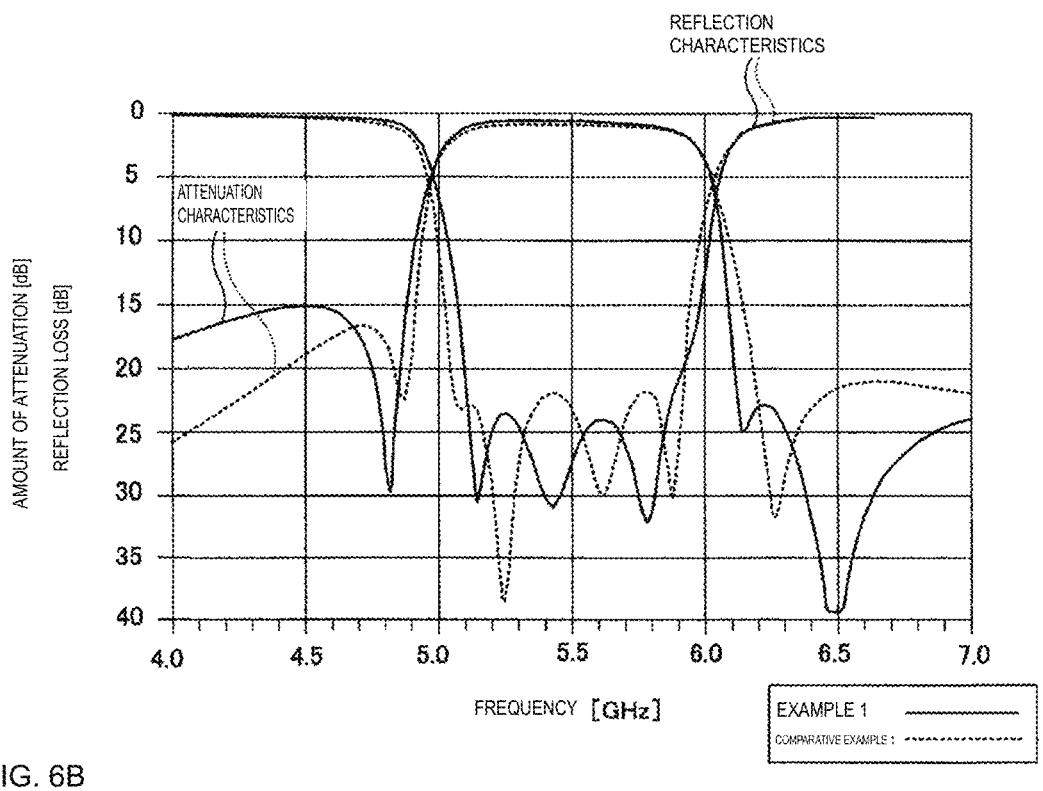
FIG. 6A is a graph illustrating attenuation characteristics and reflection characteristics of Example 1 and Comparative Example 1.
Figure 6B:
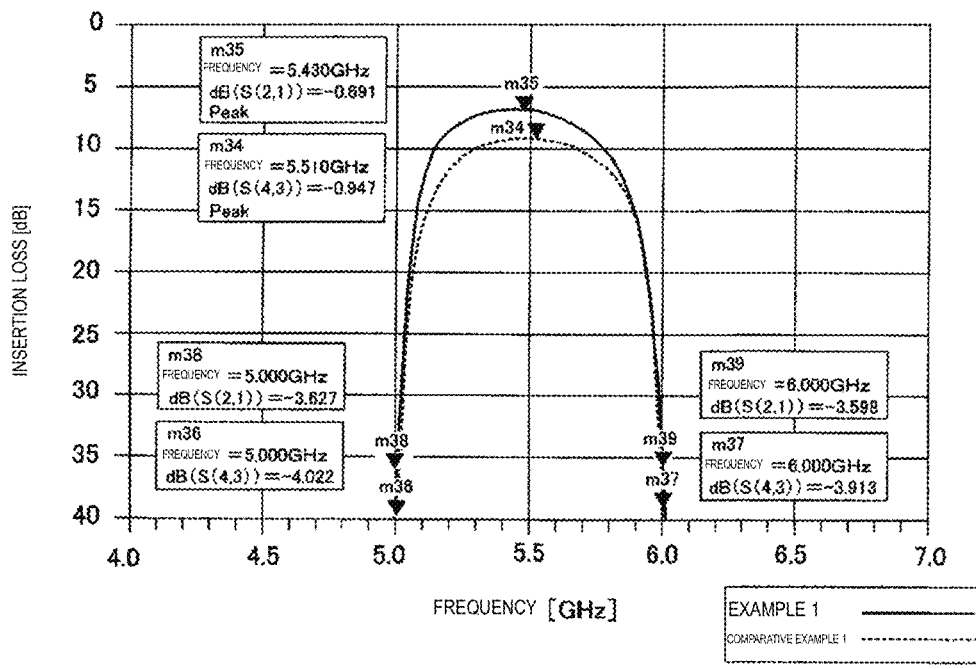
FIG. 6B is a graph illustrating insertion loss characteristics of Example 1 and Comparative Example 1.

The frequency characteristics of each of the multilayer LC filter 100 according to Example 1 and the multilayer LC filter 1100 according to Comparative Example 1 were measured. FIG. 6A illustrates the respective attenuation characteristics and reflection characteristics. FIG. 6B illustrates the respective insertion loss characteristics. However, the first input/output terminal T1 of the multilayer LC filter 100 was defined as a first terminal, the second input/output terminal T2 thereof was defined as a second terminal, the first input/output terminal T1 of the multilayer LC filter 1100 was defined as a third terminal, and the second input/output terminal T2 thereof was defined as a fourth terminal.

As can be seen from FIG. 6A, the multilayer LC filter 100 according to Example 1 and the multilayer LC filter 1100 according to Comparative Example 1 have substantially the same reflection characteristics and substantially the same attenuation characteristics outside the pass band.

On the other hand, as can be seen from FIG. 6B, the multilayer LC filter 100 according to Example 1 has a smaller insertion loss than the multilayer LC filter 1100 according to Comparative Example 1. To be specific, the multilayer LC filter 100 has an insertion loss improved by about 0.24 dB as compared with the multilayer LC filter 1100. As described above, the effectiveness of the multilayer LC filter according to a preferred embodiment of the present invention was confirmed.

Experiment 2

Using the simulator, the following experiment was performed.

Figure 7A:
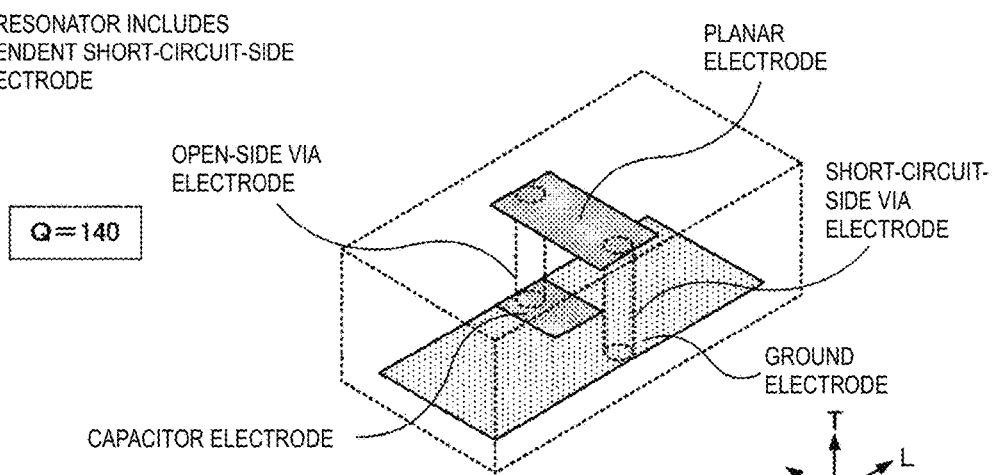
FIGS. 7A and 7B each are explanatory diagrams illustrating Experiment 2.
Figure 7B:
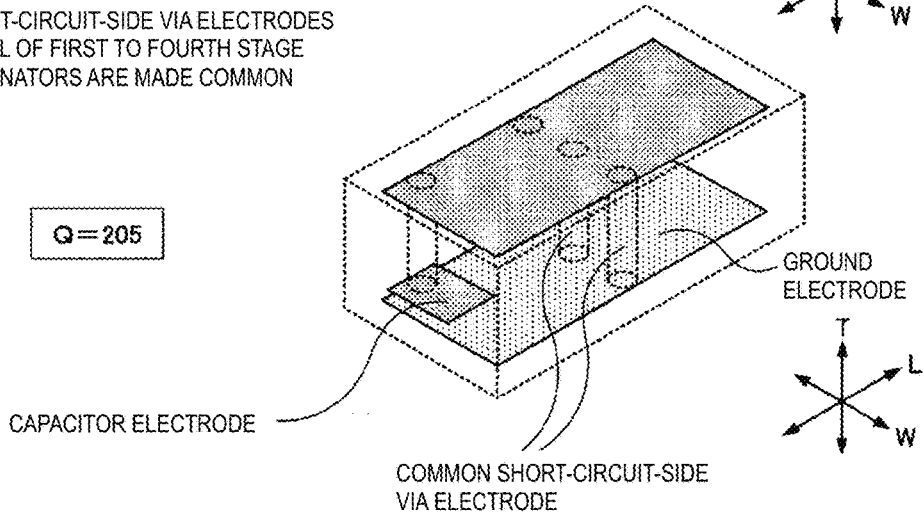

Two multilayer LC filters according to Sample 1 and Sample 2 were prepared. Each of the two multilayer LC filters is a four-stage band pass filter in which four LC resonators are electromagnetic field coupled. The dimensions of the multilayer LC filter were set to 0.6 mm in the height direction T, 1.6 mm in the length direction L, and 0.8 mm in the width direction W. FIG. 7A illustrates a multilayer LC filter according to Sample 1. FIG. 7B illustrates a multilayer LC filter according to Sample 2.

In the multilayer LC filter of Sample 1, each of the four LC resonators includes an independent short-circuit side via electrode. In the multilayer LC filter of Sample 2, the short-circuit side via electrodes of all of a first stage to a fourth stage LC resonators are made common.

A simulator was used to measure the Q value of the second stage LC resonator of each multilayer LC filter. The Q value of the second stage LC resonator of the multilayer LC filter according to Sample 1 was 140. The Q value of the second stage LC resonator of the multilayer LC filter according to Sample 2 was 205.

From the above results, it was confirmed that the short-circuit side via electrodes of the LC resonators included in the multilayer LC filter were made common as in various preferred embodiments of the present invention, thus improving the Q value of each LC resonator.

Second Preferred Embodiment

Figure 8:
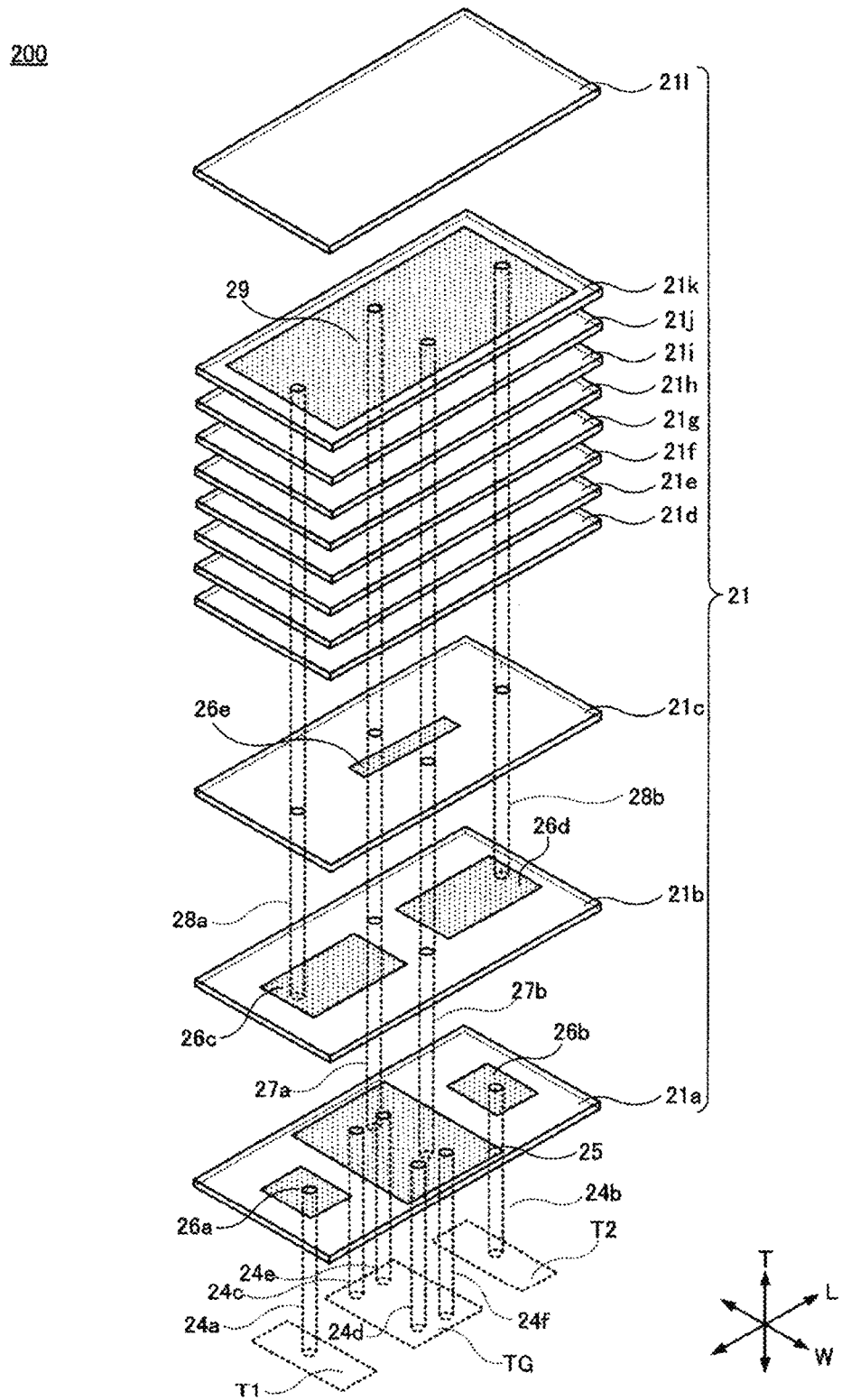
FIG. 8 is an exploded perspective view of a multilayer LC filter 200 according to a second preferred embodiment of the present invention.
Figure 9:
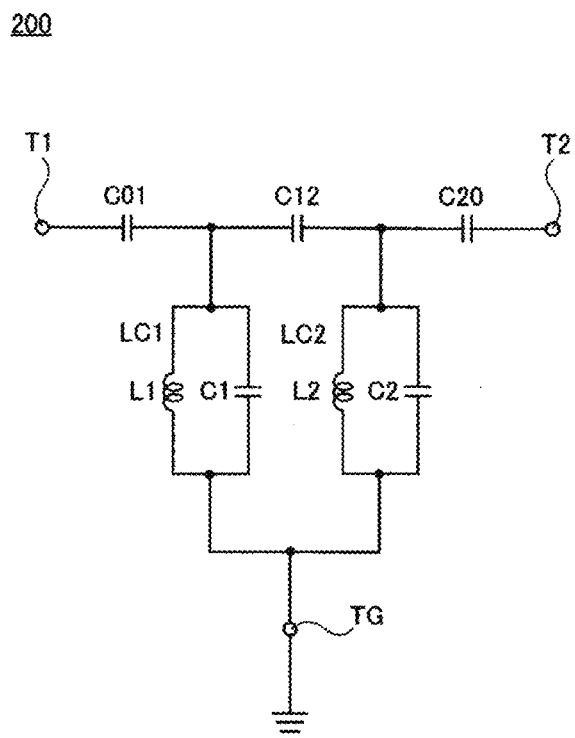
FIG. 9 is an equivalent circuit diagram of the multilayer LC filter 200.

FIG. 8 and FIG. 9 illustrate a multilayer LC filter 200 according to a second preferred embodiment. However, FIG. 8 is an exploded perspective view of the multilayer LC filter 200. FIG. 9 is an equivalent circuit diagram of the multilayer LC filter 200.

The multilayer LC filter 200 according to the second preferred embodiment is obtained by modifying a portion of the configuration of the multilayer LC filter 100 according to the first preferred embodiment described above. To be specific, while the multilayer LC filter 100 is a four-stage band pass filter in which the first LC resonator LC1 and the second LC resonator LC2 are electromagnetic field coupled, the second LC resonator LC2 and the third LC resonator LC3 are electromagnetic field coupled, and the third LC resonator LC3 and the fourth LC resonator LC4 are electromagnetic field coupled, the multilayer LC filter 200 is modified to a two-stage band pass filter in which the first LC resonator LC1 and the second LC resonator LC2 are electromagnetic field coupled.

The multilayer LC filter 200 includes a multilayer body 21. The multilayer body 21 is formed by laminating insulator layers 21a to 21l.

Hereinafter, the configuration of each of the insulator layers 21a to 21l will be described.

The first input/output terminal T1, the second input/output terminal T2, and the ground terminal TG are provided on a lower main surface of the insulator layer 21a.

Via electrodes 24a, 24b, 24c, 24d, 24e, and 24f extend between both main surfaces of the insulator layer 21a.

A ground electrode 25 and capacitor electrodes 26a and 26b are provided on an upper main surface of the insulator layer 21a.

Common short-circuit side via electrodes 27a and 27b extend between both main surfaces of the insulator layer 21b.

Capacitor electrodes 26c and 26d are provided on an upper main surface of the insulator layer 21b.

The common short-circuit side via electrodes 27a and 27b described above extend between both main surfaces of the insulator layer 21c. In addition, open-side via electrodes 28a and 28b extend between both main surfaces of the insulator layer 21c.

A capacitor electrode 26e is provided on an upper main surface of the insulator layer 21c.

In each of the insulator layers 21d to 21k, the common short-circuit side via electrodes 27a and 27b and the open-side via electrodes 28a and 28b described above extend between both main surfaces.

A planar electrode 29 is provided on an upper main surface of the insulator layer 21k.

The insulator layer 21l is a protection layer and is not provided with an electrode.

The first input/output terminal T1 is connected to the capacitor electrode 26a by the via electrode 24a. The second input/output terminal T2 is connected to the capacitor electrode 26b by the via electrode 24b. The ground terminal TG is connected to the ground electrode 25 by the via electrodes 24c to 24f.

The capacitor electrode 26c is connected to the planar electrode 29 by the open-side via electrode 28a. The capacitor electrode 26d is connected to the planar electrode 29 by the open-side via electrode 28b.

The planar electrode 29 is connected to the ground electrode 25 by the common short-circuit side via electrodes 27a and 27b.

The multilayer LC filter 200 having the above-described structure includes an equivalent circuit illustrated in FIG. 9.

The multilayer LC filter 200 includes the first input/output terminal T1, the second input/output terminal T2, and the ground terminal TG.

The capacitors C01 and C12 and a capacitor C20 are connected in this order between the first input/output terminal T1 and the second input/output terminal T2.

The first LC resonator LC1 including the inductor L1 and the capacitor C1 that are connected in parallel is connected between the connection point of the capacitor C01 and the capacitor C12 and the ground (ground terminal TG).

The second LC resonator LC2 including the inductor L2 and the capacitor C2 connected in parallel is connected between the connection point of the capacitor C12 and the capacitor C20 and the ground.

The first LC resonator LC1 and the second LC resonator LC2 are electromagnetic field coupled to each other.

Next, the relationship between the structure of the multilayer LC filter 200 illustrated in FIG. 8 and the equivalent circuit of the multilayer LC filter 200 illustrated in FIG. 9 will be described.

As described above, the first input/output terminal T1 is connected to the capacitor electrode 26a by the via electrode 24a. The capacitor C01 is provided by the capacitance generated between the capacitor electrode 26a and the capacitor electrode 26c.

The capacitor C12 is provided by the capacitance generated between the capacitor electrode 26c and the capacitor electrode 26e and the capacitance generated between the capacitor electrode 26e and the capacitor electrode 26d, which are connected in series with each other.

The capacitor C20 is provided by the capacitance generated between the capacitor electrode 26d and the capacitor electrode 26b. As described above, the capacitor electrode 26b is connected to the second input/output terminal T2 by the via electrode 24b.

The inductor L1 is provided by a conductive path extending from the capacitor electrode 26c to the ground electrode 25 through the open-side via electrode 28a, the planar electrode 29, and the common short-circuit side via electrodes 27a and 27b. The capacitor C1 is provided by the capacitance generated between the capacitor electrode 26c and the ground electrode 25. As described above, the inductor L1 and the capacitor C1 define the first LC resonator LC1.

The inductor L2 is provided by a conductive path extending from the capacitor electrode 26d to the ground electrode 25 through the open-side via electrode 28b, the planar electrode 29, and the common short-circuit side via electrodes 27a and 27b. The capacitor C2 is provided by the capacitance generated between the capacitor electrode 26d and the ground electrode 25. As described above, the inductor L2 and the capacitor C2 define the second LC resonator LC2.

As described above, the ground electrode 25 is connected to the ground terminal TG by the via electrodes 24c to 24f.

As described above, the structure of the multilayer LC filter 200 illustrated in FIG. 8 configures the equivalent circuit of the multilayer LC filter 200 illustrated in FIG. 9.

In the multilayer LC filter 200, as in the multilayer LC filter 100, the short-circuit side via electrodes of the plurality of LC resonators are made common, such that the Q values of the LC resonators each are improved. That is, in the multilayer LC filter 200, the short-circuit side via electrode of the first LC resonator LC1 and the short-circuit side via electrode of the second LC resonator LC2 are made common to be the common short-circuit side via electrodes 27a and 27b, such that the Q value of each of the first LC resonator LC1 and the second LC resonator LC2 is improved.

In the multilayer LC filter 200, since the Q value of each of the first LC resonator LC1 and the second LC resonator LC2 is improved, excellent frequency characteristics are provided and insertion loss is reduced.

Third Preferred Embodiment

Figure 10:
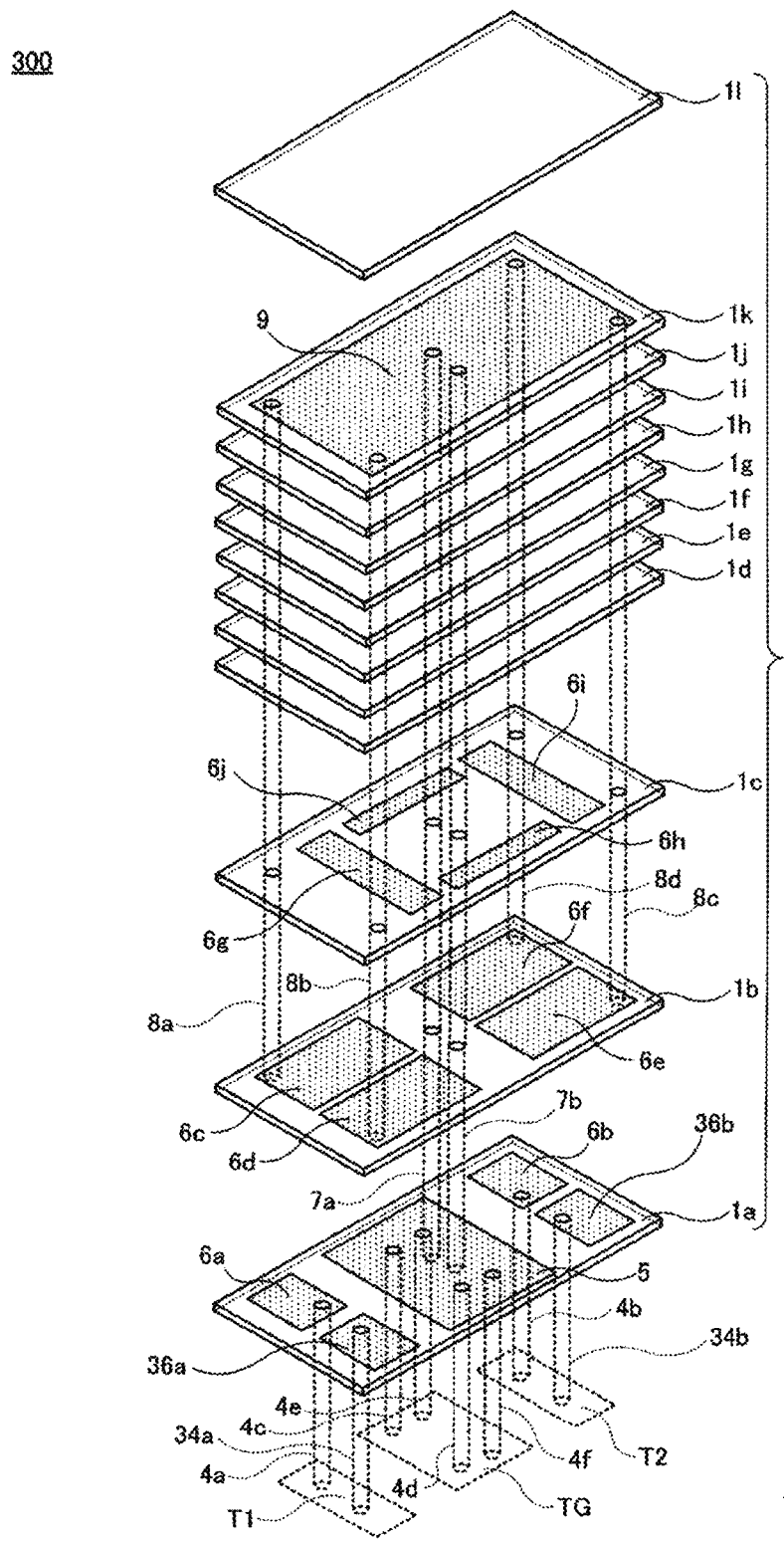
FIG. 10 is an exploded perspective view of a multilayer LC filter 300 according to a third preferred embodiment of the present invention.
Figure 11:
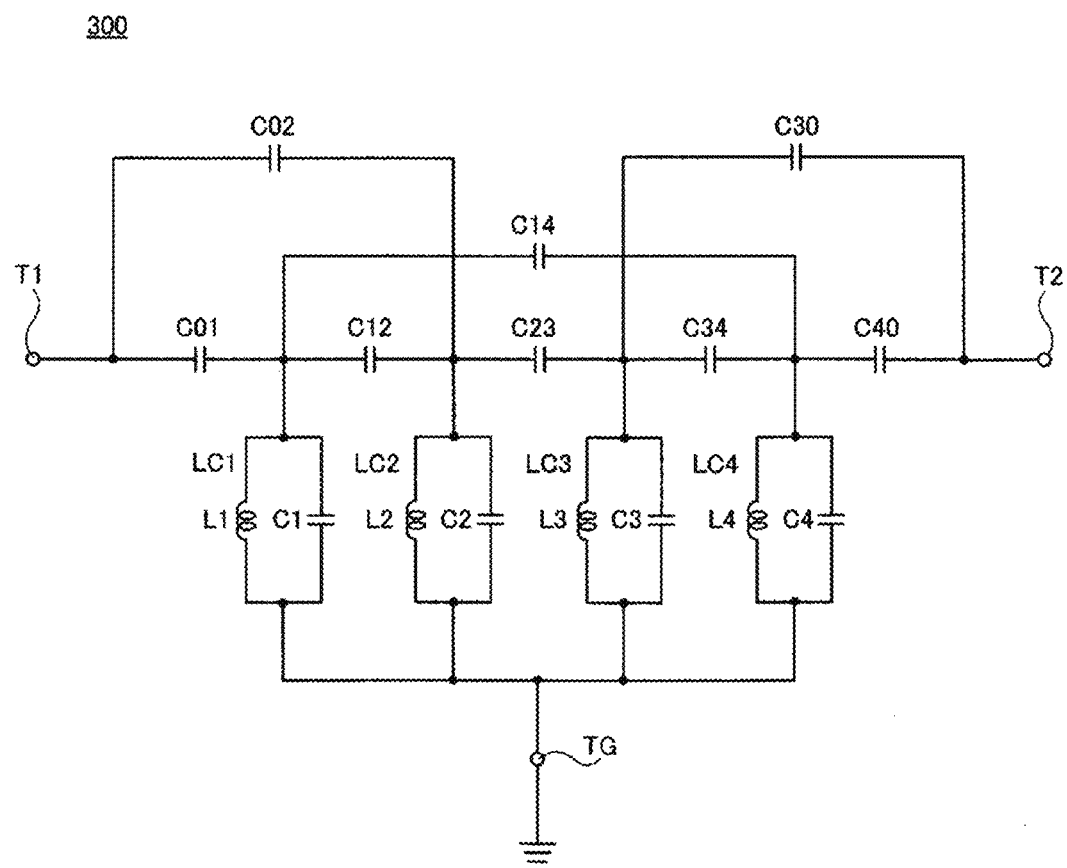
FIG. 11 is an equivalent circuit diagram of the multilayer LC filter 300.

FIG. 10 and FIG. 11 show a multilayer LC filter 300 according to a third preferred embodiment. However, FIG. 10 is an exploded perspective view of the multilayer LC filter 300. FIG. 11 is an equivalent circuit diagram of the multilayer LC filter 300.

The multilayer LC filter 300 according to the third preferred embodiment is obtained by adding a new configuration to the multilayer LC filter 100 according to the first preferred embodiment described above.

To be specific, in the multilayer LC filter 300, new via electrodes 34a and 34b are added to the multilayer LC filter 100 so as to extend between both main surfaces of the insulator layer 1a. In addition, in the multilayer LC filter 300, new capacitor electrodes 36a and 36b are added to the multilayer LC filter 100 on the upper main surface of the insulator layer 1a thereof.

The capacitor electrode 36a is connected to the first input/output terminal T1 by the via electrode 34a. The capacitor electrode 36b is connected to the second input/output terminal T2 by the via electrode 34b.

A capacitor C02 is provided by the capacitance generated between the capacitor electrode 36a and the capacitor electrode 6d. A capacitor C30 is provided by the capacitance generated between the capacitor electrode 36b and the capacitor electrode 6e.

As a result, the multilayer LC filter 300 includes the equivalent circuit illustrated in FIG. 11. That is, the capacitor C02 is connected between the first input/output terminal T1 and the second LC resonator LC2. In addition, the capacitor C30 is connected between the third LC resonator LC3 and the second input/output terminal T2.

In the multilayer LC filter 300, the size and the shape of the capacitor electrode 36a are adjusted to adjust the capacitance value of the capacitor C02, and the size and the shape of the capacitor electrode 36b are adjusted to adjust the capacitance value of the capacitor C30, so that the frequency characteristics can be adjusted. In order to clarify this, the following Experiment 3 was conducted.

Experiment 3

The sizes and shapes of the capacitor electrode 36a and the capacitor electrode 36b were changed from those illustrated in FIG. 10, the capacitance value of the capacitor C02 and the capacitance value of the capacitor C30 were adjusted, and the multilayer LC filter 300 according to Example 2 and the multilayer LC filter 300 according to Example 3, which are different in the frequency characteristics from each other, were prepared. Note that formation positions, diameters, and the like of the via electrodes 34a and 34b were not changed.

The sizes and shapes of the capacitor electrode 36a and the capacitor electrode 36b are adjusted, such that the capacitance value of the capacitor C02 and the capacitance value of the capacitor C30 are larger in Example 2 than in Example 3.

Figure 12:
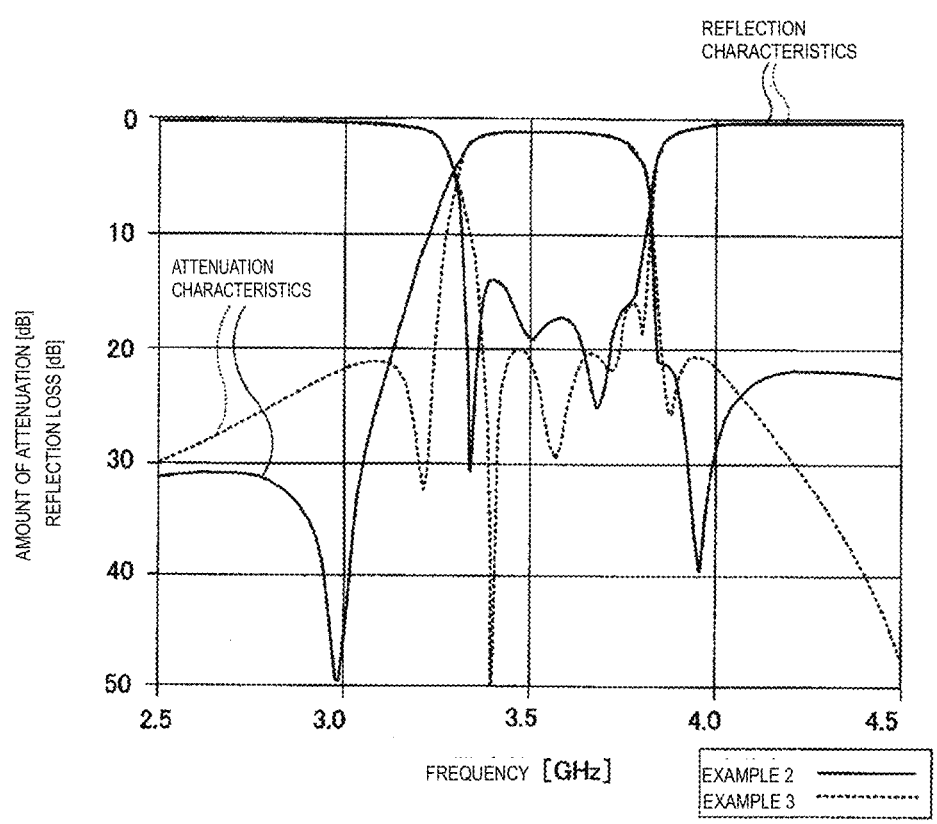
FIG. 12 is a graph illustrating attenuation characteristics and reflection characteristics of Example 2 and Example 3.

FIG. 12 illustrates attenuation characteristics and reflection characteristics of each of the multilayer LC filter 300 according to Example 2 and the multilayer LC filter 300 according to Example 3.

As can be seen from FIG. 12, in the multilayer LC filter 300 according to Example 2 in which the capacitance value of the capacitor C02 and the capacitance value of the capacitor C30 are large, a gentle but deep attenuation is obtained on the low-frequency side of the pass band. On the other hand, in the multilayer LC filter 300 according to Example 3 in which the capacitance value of the capacitor C02 and the capacitance value of the capacitor C30 are small, a shallow but steep attenuation is obtained on the low-frequency side of the pass band.

As described above, a multilayer LC filter according to a preferred embodiment of the present invention can easily adjust the frequency characteristics by adjusting the size and shape of the capacitor electrode.

Fourth Preferred Embodiment

Figure 13A:
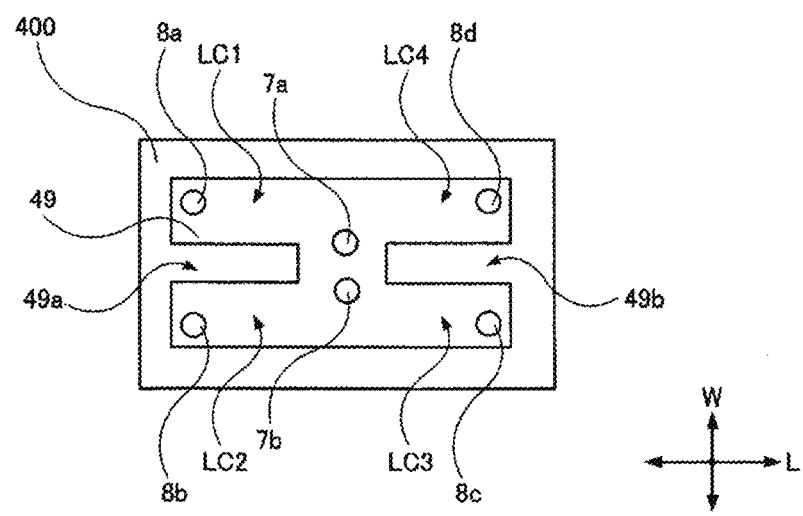
FIG. 13A is an explanatory diagram of a multilayer LC filter 400 according to a fourth preferred embodiment.

FIG. 13A illustrates a multilayer LC filter 400 according to a fourth preferred embodiment. However, FIG. 13A is an explanatory diagram illustrating the shape of a planar electrode 49 of the multilayer LC filter 400, the formation position of each of the first LC resonator LC1 to the fourth LC resonator LC4, the formation position of each of the open-side via electrodes 8a, 8b, 8c, and 8d, and the formation position of each of the common short-circuit side via electrodes 7a and 7b.

The multilayer LC filter 400 according to the fourth preferred embodiment is obtained by modifying a portion of the configuration of the multilayer LC filter 100 according to the first preferred embodiment described above. To be specific, the planar electrode 9 of the multilayer LC filter 100, which has a rectangular or substantially rectangular shape, is modified, so that in the multilayer LC filter 400, two slits 49a and 49b are located in the planar electrode 49. Note that the planar electrodes of the first LC resonator LC1 to the fourth LC resonator LC4 included in the multilayer LC filter 100 are made common, which is the planar electrode 9, and also, the planar electrodes of the first LC resonator LC1 to the fourth LC resonator LC4 included in the multilayer LC filter 400 are made common, which is the planar electrode 49.

As illustrated in FIG. 13a, the slit 49a is between the first LC resonator LC1 and the second LC resonator LC2. In addition, the slit 49b is between the third LC resonator LC3 and the fourth LC resonator LC4. As a result, in the multilayer LC filter 400, the coupling between the first LC resonator LC1 and the second LC resonator LC2 is weakened, and the coupling between the third LC resonator LC3 and the fourth LC resonator LC4 is weakened.

In this manner, the slits 49a and 49b are located in the planar electrode 49 that is made common for the first LC resonator LC1 to the fourth resonator LC4 included in the multilayer LC filter 400, so that the coupling between the resonators can be adjusted (weakened). The slits in the planar electrode that is made common can be used to adjust the frequency characteristics of the multilayer LC filter.

Fifth Preferred Embodiment

Figure 13B:
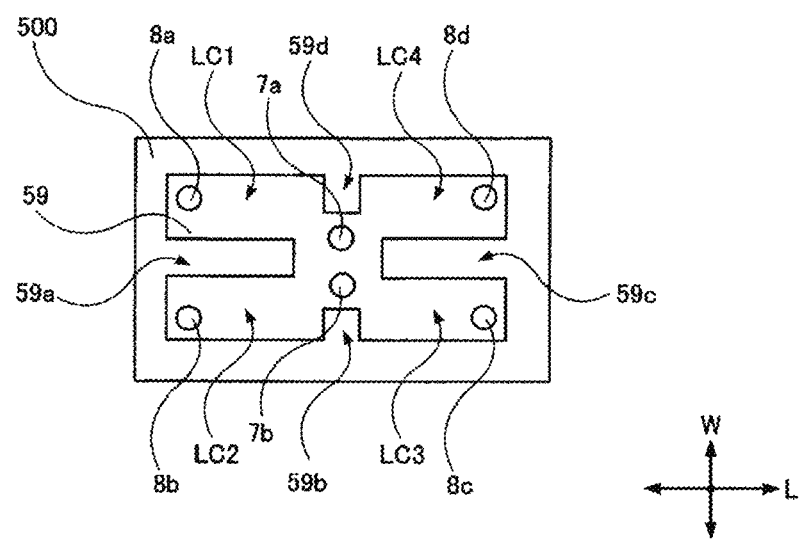
FIG. 13B is an explanatory diagram of a multilayer LC filter 500 according to a fifth preferred embodiment of the present invention.

FIG. 13B illustrates a multilayer LC filter 500 according to a fifth preferred embodiment. However, FIG. 13B is an explanatory diagram illustrating the shape of a planar electrode 59 of the multilayer LC filter 500, the formation position of each of the first LC resonator LC1 to the fourth LC resonator LC4, the formation position of each of the open-side via electrodes 8a, 8b, 8c, and 8d, and the formation position of each of the common short-circuit side via electrodes 7a and 7b.

The multilayer LC filter 500 according to the fifth preferred embodiment is obtained by further modifying the multilayer LC filter 400 according to the fourth preferred embodiment. To be specific, in the multilayer LC filter 500, a slit 59a is between the first LC resonator LC1 and the second LC resonator LC2 in the planar electrode 59, a slit 59b is between the second LC resonator LC2 and the third LC resonator LC3, a slit 59c is between the third LC resonator LC3 and the fourth LC resonator LC4, and a slit 59d is between the fourth LC resonator LC4 and the first LC resonator LC1.

In the multilayer LC filter 500, the coupling between the first LC resonator LC1 and the second LC resonator LC2, the coupling between the second LC resonator LC2 and the third LC resonator LC3, the coupling between the third LC resonator LC3 and the fourth LC resonator LC4, and the coupling between the fourth LC resonator LC4 and the first LC resonator LC1 are each weakened.

Sixth Preferred Embodiment

Figure 14A:
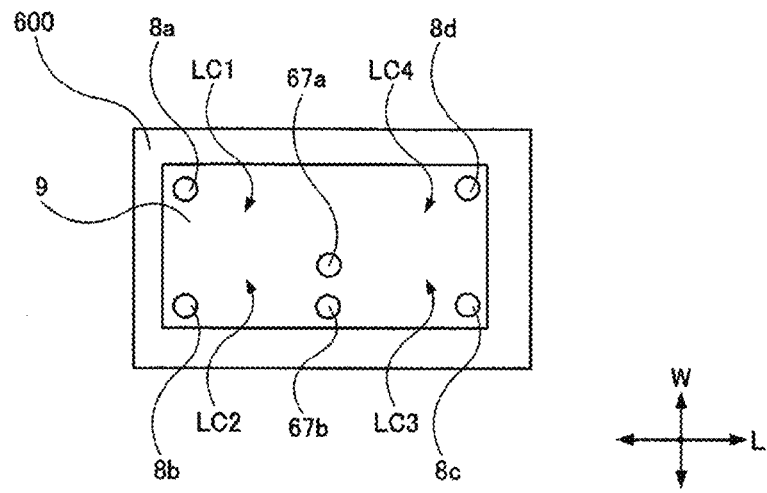
FIG. 14A is an explanatory diagram of a multilayer LC filter 600 according to a sixth preferred embodiment.

FIG. 14A illustrates a multilayer LC filter 600 according to a sixth preferred embodiment. However, FIG. 14A is an explanatory diagram illustrating the shape of the planar electrode 9 of the multilayer LC filter 600, the formation position of each of the first LC resonator LC1 to the fourth LC resonator LC4, the formation position of each of the open-side via electrodes 8a, 8b, 8c, and 8d, and the formation position of common short-circuit side via electrodes 67a and 67b.

The multilayer LC filter 600 according to the sixth preferred embodiment is obtained by modifying a portion of the configuration of the multilayer LC filter 100 according to the first preferred embodiment described above. To be specific, in the multilayer LC filter 100, the common short-circuit side via electrodes 7a and 7b are near the center of the planar electrode 9. This configuration is modified, so that in the multilayer LC filter 600, the common short-circuit side via electrodes 67a and 67b are eccentrically located between the second LC resonator LC2 and the third LC resonator LC3 in the planar electrode 9.

In the multilayer LC filter 600, the coupling between the second LC resonator LC2 and the third LC resonator LC3 is weakened.

Seventh Preferred Embodiment

Figure 14B:
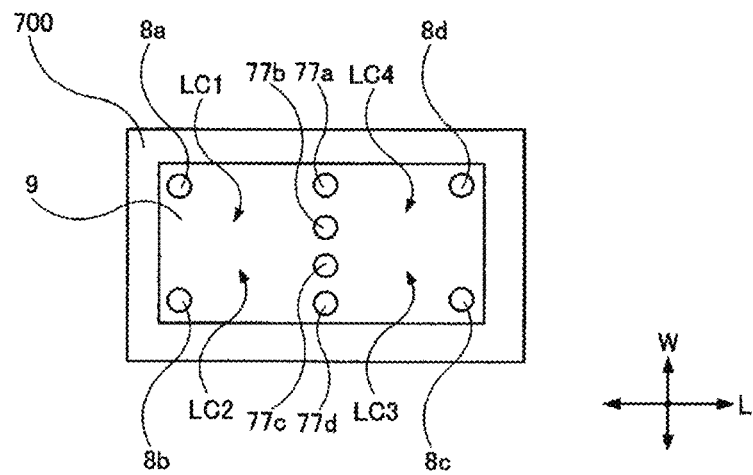
FIG. 14B is an explanatory diagram of a multilayer LC filter 700 according to a seventh preferred embodiment.

FIG. 14B illustrates a multilayer LC filter 700 according to a seventh preferred embodiment. However, FIG. 14B is an explanatory diagram illustrating the shape of the planar electrode 9 of the multilayer LC filter 700, the formation position of each of the first LC resonator LC1 to the fourth LC resonator LC4, the formation position of each of the open-side via electrodes 8a, 8b, 8c, and 8d, and the formation position of each of common short-circuit side via electrodes 77a, 77b, 77c, and 77d.

The multilayer LC filter 700 according to the seventh preferred embodiment is obtained by modifying a portion of the configuration of the multilayer LC filter 100 according to the first preferred embodiment described above. To be specific, in the multilayer LC filter 100, the two common short-circuit side via electrodes 7a and 7b are near the center of the planar electrode 9. This configuration is modified, so that in the multilayer LC filter 700, the four common short-circuit side via electrodes 77a, 77b, 77c, and 77d are between the first LC resonator LC1 and the second LC resonator LC2, and the third LC resonator LC3 and the fourth LC resonator LC4 in the planar electrode 9.

In the multilayer LC filter 700, the coupling between the first LC resonator LC1 and the fourth LC resonator LC4 and the coupling between the second LC resonator LC2 and the third LC resonator LC3 are each weakened.

Eighth Preferred Embodiment

Figure 14C:
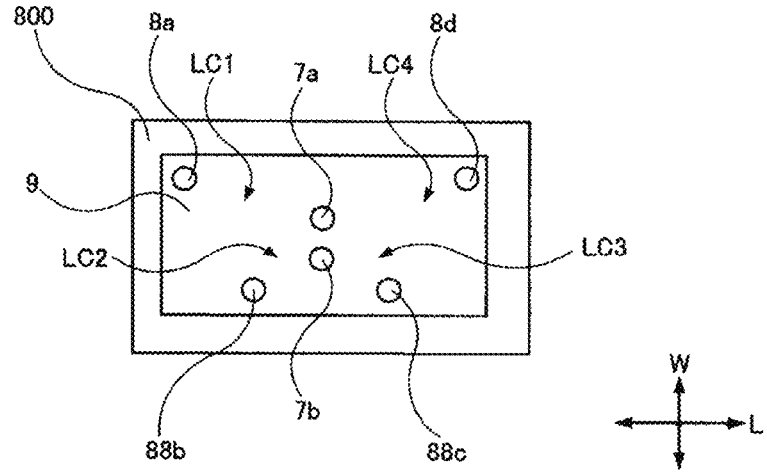
FIG. 14C is an explanatory diagram of a multilayer LC filter 800 according to an eighth preferred embodiment of the present invention.

FIG. 14C illustrates a multilayer LC filter 800 according to an eighth preferred embodiment. However, FIG. 14C is an explanatory diagram illustrating the shape of the planar electrode 9 of the multilayer LC filter 800, the formation position of each of the first LC resonator LC1 to the fourth LC resonator LC4, the formation position of each of the open-side via electrodes 8a and 8d and open-side via electrodes 88b and 88c, and the formation position of each of the common short-circuit side via electrodes 7a and 7b.

The multilayer LC filter 800 according to the eighth preferred embodiment is obtained by modifying a portion of the configuration of the multilayer LC filter 100 according to the first preferred embodiment described above. To be specific, in the multilayer LC filter 100, the four open-side via electrodes 8a, 8b, 8c, and 8d of the first LC resonator LC1 to the fourth LC resonator LC4 are arranged separately at four corners inside the multilayer body 1. This configuration is modified, so that in the multilayer LC filter 800, the open-side via electrode 88b of the second LC resonator LC2 and the open-side via electrode 88c of the third LC resonator LC3 are arranged so as to be close to each other. Note that the formation position of the open-side via electrode 8a of the first LC resonator LC1 and the formation position of the open-side via electrode 8d of the fourth LC resonator LC4 were not changed.

In the multilayer LC filter 800, the coupling between the second LC resonator LC2 and the third LC resonator LC3 is strengthened. Note that instead of bringing the open-side via electrode of the second LC resonator LC2 and the open-side via electrode of the third LC resonator LC3 close to each other, the open-side via electrode of the first LC resonator LC1 and the open-side via electrode of the fourth LC resonator LC4 may be brought close to each other.

Ninth Preferred Embodiment

Figure 15:
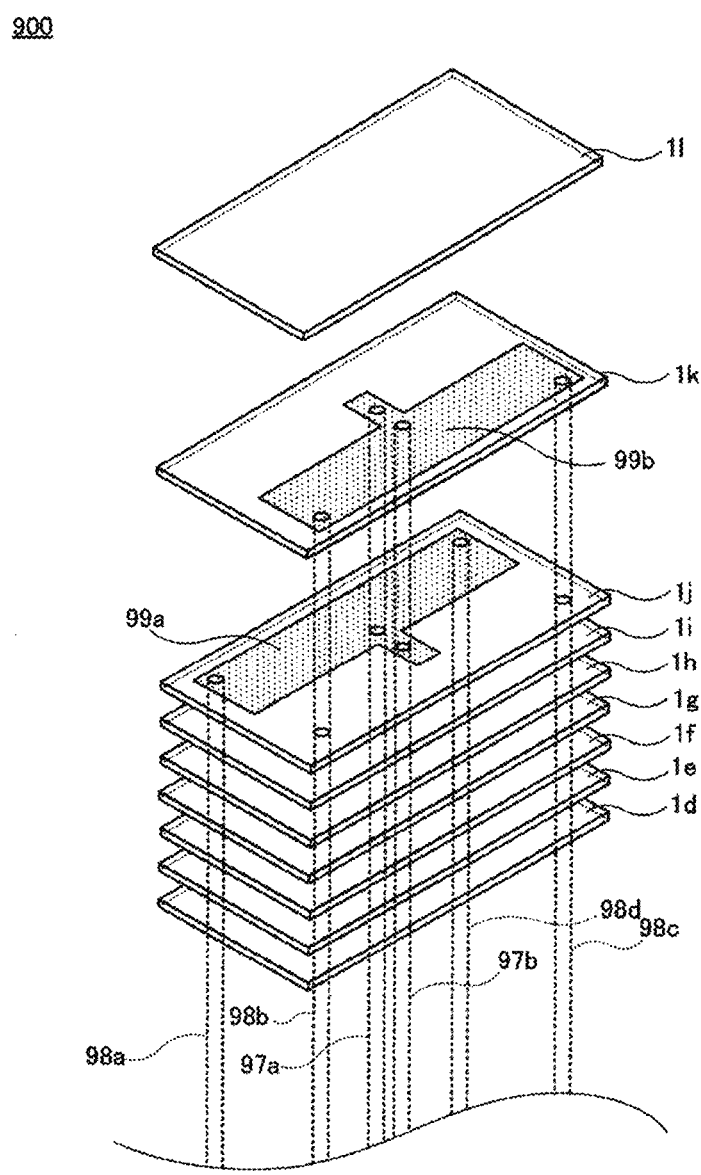
FIG. 15 is an exploded perspective view of a main portion of a multilayer LC filter 900 according to a ninth preferred embodiment of the present invention.
Figure 16:
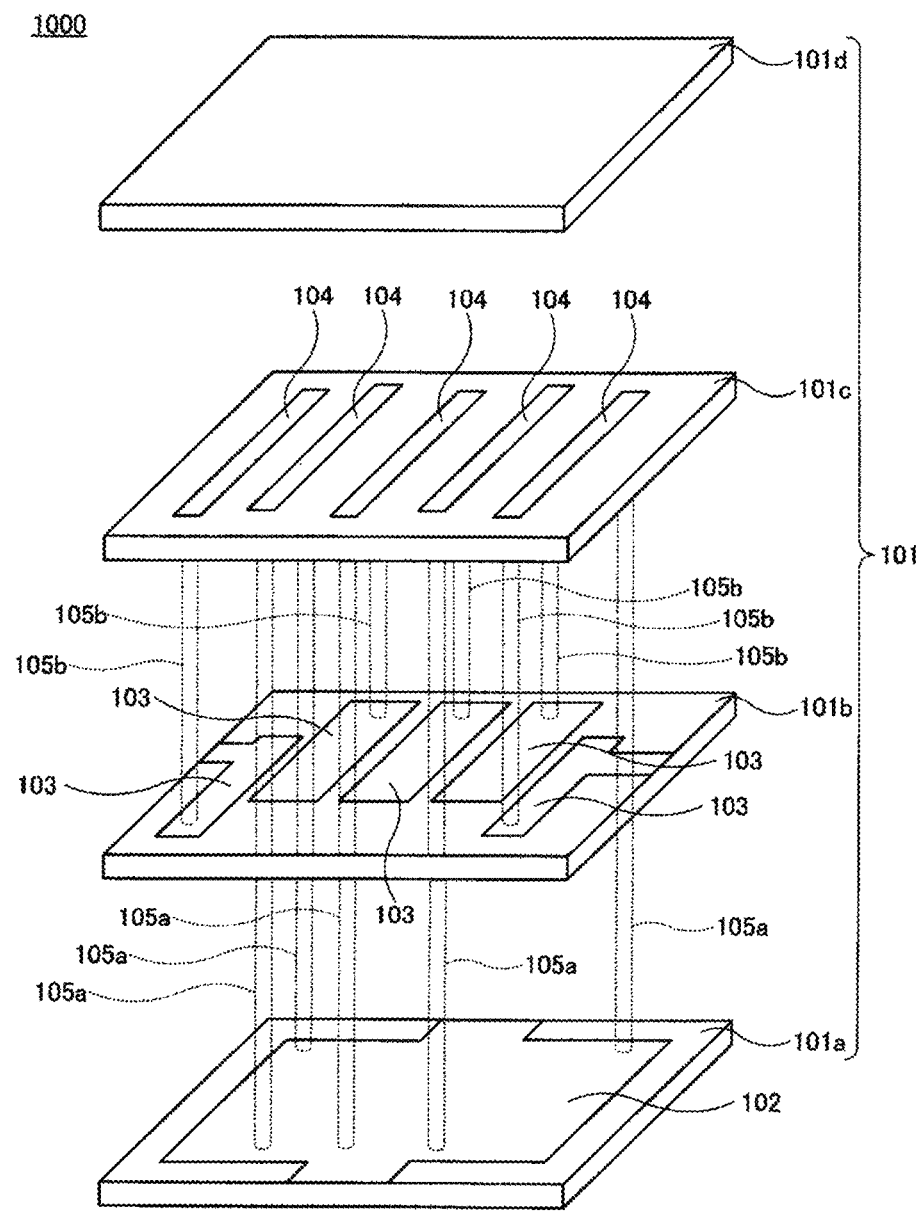
FIG. 16 is an exploded perspective view of a multilayer LC filter 1000 disclosed in WO 2007/119356A1.

FIG. 15 illustrates a multilayer LC filter 900 according to a ninth preferred embodiment. However, FIG. 15 is an exploded perspective view of a main part of the multilayer LC filter 900.

The multilayer LC filter 900 according to the ninth preferred embodiment is obtained by modifying a portion of the configuration of the multilayer LC filter 100 according to the first preferred embodiment described above. To be specific, in the multilayer LC filter 100, one planar electrode 9 is provided on the insulator layer 1k, and all of the four open-side via electrodes 8a, 8b, 8c, and 8d of the first LC resonator LC1 to the fourth LC resonator LC4 and the two common short-circuit side via electrodes 7a and 7b are connected to the planar electrode 9. This configuration is modified, so that in the multilayer LC filter 900, one planar electrode 99a is provided on the insulator layer 1j and another planar electrode 99b is provided on the insulator layer 1k. Then, an open-side via electrode 98a of the first LC resonator LC1 and an open-side via electrode 98d of the fourth LC resonator LC4 are connected to the planar electrode 99a, and an open-side via electrode 98b of the second LC resonator LC2 and an open-side via electrode 98c of the third LC resonator LC3 are connected to the planar electrode 99b. Two common short-circuit side via electrodes 97a and 97b each are connected to the planar electrode 99a and the planar electrode 99b.

In the multilayer LC filter 900, the coupling between the first LC resonator LC1 and the second LC resonator LC2 and the coupling between the third LC resonator LC3 and the fourth LC resonator LC4 are each weakened. Note that the open-side via electrode connected to the planar electrode 99a and the planar electrode 99b may be modified from those described above to other electrodes. Further, the formation positions of the planar electrode 99a and the planar electrode 99b may be changed, the planar electrode 99b may be provided on the insulator layer 1j, and the planar electrode 99a may be provided on the insulator layer 1k.

As described above, the number of planar electrodes is not limited to one, and a plurality of planar electrodes may be provided. In addition, the planar electrodes may be each provided in different layers of the insulator layer. In addition, the common short-circuit side via electrodes may be each connected to planar electrodes in different layers.

The multilayer LC filters 100, 200, 300, 400, 500, 600, 700, 800, and 900 according to the first to ninth preferred embodiments have been described above. However, the present invention is not limited to the contents described above, and various modifications can be made along the gist of the present invention.

For example, in the multilayer LC filters 100 to 900, the capacitor C01 is connected between the first input/output terminal T1 and the first LC resonator LC1, and the capacitor C40 (capacitor C20) is connected between the fourth LC resonator LC4 (second LC resonator LC2) and the first input/output terminal T1, however, the capacitor C01 and the capacitor C40 (capacitor C20) may be omitted.

In addition, although the multilayer LC filters 100 and 300 to 900 are four-stage band pass filters and the multilayer LC filter 200 is a two-stage band pass filter, the number of stages of the filter can be increased or decreased as appropriate. Also, the type of filter is not limited to a band pass filter, and can be changed to a low pass filter, a high pass filter, or the like.

Multilayer LC filters according to preferred embodiments of the present invention are as described above.

In a multilayer LC filter, it is also preferable that a short-circuit side via electrode that is made common for all of the LC resonators be between the open-side via electrode of at least one LC resonator and the open-side via electrode of at least one other LC resonator in the length direction of the multilayer body. In addition, it is also preferable that a short-circuit side via electrode that is made common for all of the LC resonators be between the open-side via electrode of at least one LC resonator and the open-side via electrode of at least one other LC resonator in the width direction of the multilayer body. In these cases, the Q value of each LC resonator is improved.

In addition, it is also preferable that four LC resonators be provided in the multilayer body, and the respective open-side via electrodes of the four LC resonators be separately arranged at four corners inside the multilayer body when viewed in the lamination direction of the insulator layers. In this case, the Q value of each LC resonator is improved.

In addition, it is also preferable that the short-circuit side via electrode that is made common for all of the LC resonators include a plurality of via electrodes. In this case, since the resistance is reduced, the Q value of each LC resonator is improved.

Further, it is also preferable that the plurality of via electrodes of the short-circuit side via electrode that is made common is equally spaced in the width direction. In this case, the coupling between the LC resonators on both sides of the short-circuit side via electrode that is made common can be weakened. Alternatively, it is also preferable that the plurality of via electrodes configuring the short-circuit side via electrode that is made common be eccentrically located in the width direction. Also in this case, the coupling between the LC resonators on both sides of the short-circuit side via electrode that is made common can be weakened.

In addition, it is also preferable that the planar electrode of all of the LC resonators be made common. In this case, the short-circuit side via electrode of each LC resonator is easily made common.

In this case, it is also preferable that the planar electrode that is made common for all of the LC resonators have a rectangular or substantially rectangular shape when viewed in the lamination direction of the insulator layers. In this case, the width dimension of the planar electrode can be increased, and the Q value of each LC resonator can be improved.

In this case, it is also preferable that a slit is provided in the rectangular or substantially rectangular shaped planar electrode that is made common. In this case, the coupling between the LC resonators on both sides of the slit can be weakened.

It is also a preferable case in which a first input/output terminal and a second input/output terminal are provided on an outer surface of the multilayer body, n pieces of LC resonators are provided in the multilayer body when n is an integer, the n pieces of LC resonators are coupled in order, the first input/output terminal and the second stage LC resonator are connected via a capacitor, and the (n−1)-th stage LC resonator and the second input/output terminal are connected via a capacitor. For example, it is also a preferable case in which four LC resonators are provided in the multilayer body, the four LC resonators are coupled in order, the first input/output terminal and the second stage LC resonator are connected via a capacitor, and the third stage LC resonator and the second input/output terminal are connected via a capacitor. In this case, the frequency characteristic of the multilayer LC filter can be adjusted by adjusting the capacitance value of the connected capacitor.

In addition, it is also a preferable case in which planar electrodes each are between different layers of the insulator layers, at least one open-side via electrode is connected to one planar electrode, at least one other open-side via electrode is connected to one other planar electrode between different layers, and a short-circuit side via electrode that is made common is connected to all of the planar electrodes between different layers. As described above, the frequency characteristics of the multilayer LC filter can be adjusted by changing the number and formation positions of the planar electrodes or selecting the open-side via electrode connected to each planar electrode.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer LC filter comprising:
   a multilayer body including insulator layers laminated in a lamination direction;
   at least one ground electrode between the insulator layers;
   a plurality of capacitor electrodes between the insulator layers;
   at least one planar electrode between the insulator layers; and
   a plurality of via electrodes extending the insulator layers; wherein
   the multilayer body has a rectangular or substantially rectangular parallelepiped shape and has a height direction that is the lamination direction, a length direction orthogonal to the height direction, and a width direction orthogonal to each of the height direction and the length direction;
   the via electrodes include open-side via electrodes connecting the plurality of capacitor electrodes and the at least one planar electrode and a short-circuit side via electrode connecting the at least one planar electrode and a ground electrode;
   an inductor is provided by a conductive path extending from the plurality of capacitor electrodes to the ground electrode through the open-side via electrodes, the at least one planar electrode, and the short-circuit side via electrode;
   a capacitor is provided by capacitance generated between the ground electrode and the plurality of capacitor electrodes;
   the inductor and the capacitor are connected in parallel to define an LC resonator; and
   a plurality of the LC resonators are in the multilayer body;
   each of the plurality of the LC resonators includes a respective one of the open-side via electrodes;
   the short-circuit side via electrode is a common electrode of all of the LC resonators in the multilayer body;
   the plurality of LC resonators include four LC resonators in the multilayer body; and
   when viewed in the lamination direction, the respective open-side via electrodes of the four LC resonators are separately positioned at four corners in the multilayer body.

2. The multilayer LC filter according to claim 1, wherein in the length direction of the multilayer body, the short-circuit side via electrode that is the common electrode for all of the LC resonators is between the open-side via electrode of at least one of the LC resonators and the open-side via electrode of at least one of the other LC resonators.

3. The multilayer LC filter according to claim 1, wherein in the width direction of the multilayer body, the short-circuit side via electrode that is the common electrode for all of the LC resonators is between the open-side via electrode of at least one of the LC resonators and the open-side via electrode of at least one of the other LC resonators.

4. The multilayer LC filter according to claim 1, wherein the short-circuit side via electrode that is the common electrode for all of the LC resonators includes a plurality of the via electrodes.

5. The multilayer LC filter according to claim 4, wherein the via electrodes of the short-circuit side via electrode that is the common electrode are equally spaced in the width direction.

6. The multilayer LC filter according to claim 4, wherein the via electrodes of the short-circuit side via electrode that is the common electrode are eccentrically located in the width direction.

7. The multilayer LC filter according to claim 1, wherein the at least one planar electrode is a planar electrode of all of the LC resonators that is a common electrode.

8. The multilayer LC filter according to claim 7, wherein when viewed in the lamination direction of the insulator layers, the planar electrode that is the common electrode for all of the LC resonators has a rectangular or substantially rectangular shape.

9. The multilayer LC filter according to claim 8, wherein a slit is located in the planar electrode that has the rectangular or substantially rectangular shape and is the common electrode.

10. The multilayer LC filter according to claim 1, wherein
a first input/output terminal and a second input/output terminal are provided on an outer surface of the multilayer body;
n number of the LC resonators are provided in the multilayer body, where n is an integer;
the n number of the LC resonators are coupled in order;
the first input/output terminal and a second stage of the LC resonator are connected via a capacitor; and
an (n−1)-th stage of the LC resonator and the second input/output terminal are connected via a capacitor.

11. The multilayer LC filter according to claim 10, wherein
the four LC resonators are coupled in order;
the first input/output terminal and a second stage of the four LC resonators are connected via a capacitor; and
a third stage of the four LC resonators and the second input/output terminal are connected via a capacitor.

12. The multilayer LC filter according to claim 1, wherein
the at least one planar electrode includes a plurality of planar electrodes;
each of the planar electrodes is between different layers of the insulator layers;
at least one of the open-side via electrodes is connected to one of the planar electrodes;
at least one of the other open-side via electrodes is connected to one of the other planar electrodes between different layers; and
the short-circuit side via electrode that is the common electrode is connected to all of the planar electrodes between different layers.

13. The multilayer LC filter according to claim 10, wherein a first and a second of the n number of the LC resonators are electromagnetic field coupled to each other, the second and a third of the n number of the LC resonators are electromagnetic field coupled to each other, and the third and a fourth of the n number of the LC resonators are electromagnetic field coupled to each other.

14. The multilayer LC filter according to claim 1, wherein the multilayer LC filter is a four-stage band pass LC filter.

15. The multilayer LC filter according to claim 1, wherein two slits are located in the at least one planar electrode.

16. The multilayer LC filter according to claim 15, wherein one of the two slits is located between first and second LC resonators and the other of the two slits is located between third and fourth LC resonators.

17. The multilayer LC filter according to claim 1, wherein three slits are located in the at least one planar electrode, a first of the three slits being located between first and second LC resonators, a second of the three slits being located between the second LC resonator and a third LC resonators, and a third of the three slits being located between the third LC resonator and a fourth LC resonators.

18. The multilayer LC filter according to claim 1, wherein the multilayer LC filter is one of a band pass filter, a low pass filter, or a high pass filter.

* * * * *